United States Patent
Suzuki

(10) Patent No.: US 9,082,711 B2
(45) Date of Patent: Jul. 14, 2015

(54) ORGANIC SOLAR CELL MODULE AND ORGANIC SOLAR CELL PANEL

(75) Inventor: Hiroyuki Suzuki, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 0 days.

(21) Appl. No.: 13/701,915

(22) PCT Filed: May 12, 2011

(86) PCT No.: PCT/JP2011/060945
§ 371 (c)(1),
(2), (4) Date: Dec. 4, 2012

(87) PCT Pub. No.: WO2011/162038
PCT Pub. Date: Dec. 29, 2011

(65) Prior Publication Data
US 2013/0074904 A1    Mar. 28, 2013

(30) Foreign Application Priority Data

Jun. 23, 2010  (JP) .................................. 2010-142984
Apr. 28, 2011  (JP) .................................. 2011-100606

(51) Int. Cl.
*H01L 31/042*  (2014.01)
*H01L 27/30*  (2006.01)

(52) U.S. Cl.
CPC ............. *H01L 27/302* (2013.01); *Y02E 10/542* (2013.01); *Y02E 10/549* (2013.01)

(58) Field of Classification Search
CPC .... H01L 27/302; Y02E 10/542; Y02E 10/549
USPC ......................................................... 136/244
See application file for complete search history.

(56) References Cited

U.S. PATENT DOCUMENTS

| | | | | |
|---|---|---|---|---|
| 6,469,242 | B1* | 10/2002 | Kondo | 136/251 |
| 2005/0268957 | A1* | 12/2005 | Enomoto et al. | 136/244 |
| 2006/0152833 | A1* | 7/2006 | Halls et al. | 359/883 |

FOREIGN PATENT DOCUMENTS

| | | |
|---|---|---|
| JP | 53-094194 A | 8/1978 |
| JP | 08-046231 A | 2/1996 |

(Continued)

OTHER PUBLICATIONS

Hadipour, Afshin et al., "Organic Tandem and Multi-Junction Solar Cells", 2008, Advanced Functional Materials, 18, pp. 169-181.*

(Continued)

*Primary Examiner* — Tamir Ayad
(74) *Attorney, Agent, or Firm* — Ladas & Parry LLP

(57) ABSTRACT

An organic solar cell module having a transparent substrate; a transparent electrode layer formed on the transparent substrate; a photoelectric conversion layer that is formed in a pattern on the transparent electrode layer and includes plural kinds of photoelectric conversion sections having different absorption wavelength regions; a plurality of back surface electrode layers respectively formed on the photoelectric conversion sections; an insulating layer that is formed so as to cover the plurality of back surface electrode layers and has an opening for each of the photoelectric conversion sections; and a plurality of charge-collecting wirings that are formed on the insulating layer and are disposed so as to be connected to the back surface electrode layers located at the openings of the insulting layer for the respective kinds of the photoelectric conversion sections.

4 Claims, 7 Drawing Sheets

(56) References Cited

FOREIGN PATENT DOCUMENTS

| | | |
|---|---|---|
| JP | 10-319851 A | 12/1998 |
| JP | 2001-312319 A | 11/2001 |
| JP | 2002-343998 A | 11/2002 |
| JP | 2006-066707 A | 3/2006 |
| JP | 2006-179380 A | 7/2006 |
| JP | 2009-076849 A | 4/2009 |

OTHER PUBLICATIONS

Barnett, Allen et al., "50% Efficient Solar Cell Architectures and Designs", 2006, IEEE, pp. 2560-2564.*

English machine translation of JP 2006-179380, publication date Jul. 6, 2006, Toppan Printing Co., Ltd.*

* cited by examiner

ORGANIC SOLAR CELL MODULE AND ORGANIC SOLAR CELL PANEL

TECHNICAL FIELD

The present invention relates to an organic solar cell module and an organic solar cell panel, which have design characteristics.

BACKGROUND ART

Conventionally, solar cells usually have the light-receiving surface constituted of one color. In recent years, the development of solar cell modules and solar cell panels is actively ongoing, and it has been attempted to cause solar cell modules and solar cell panels to display characters, symbols, figures, shapes and the like and to have design characteristics, for the purpose of enhancing designability or harmonizing with the scenery.

For instance, there has been disclosed a technology of imparting design characteristics to a dye-sensitized solar cell module, by producing a unit solar cell element having two or more colors by supporting different kinds of dyes in a porous oxide semiconductor layer, and aligning the unit solar cell elements having two or more colors in a mosaic form so as to form a pattern of particular characters, symbols or figures (see Patent Literature 1).

CITATION LIST

Patent Literature

Patent Literature 1: Japanese Patent Application Publication (Laid-Open) No. 2006-179380

SUMMARY OF INVENTION

Technical Problem

Organic solar cell modules and organic solar cell panels can be imparted with excellent design characteristics by forming plural kinds of photoelectric conversion layers on the same substrate by using plural kinds of organic materials having different absorption wavelength regions, and arranging the plural kinds of photoelectric conversion layers to display an arbitrary pattern of characters, symbols, figures, shapes and the like.

Such organic solar cell modules and organic solar cell panels have a constitution in which plural kinds of photoelectric conversion layers are arranged in a planar fashion and sandwiched between electrodes that are facing each other on the same substrate, so that the organic solar cell modules and organic solar cell panels can be dealt with as equivalent circuits having a plurality of photovoltaic cells are connected in parallel. In these photovoltaic cells, because the oxidation-reduction potentials of the organic materials used in the various photoelectric conversion layers differ from one another, the photovoltaic cells exhibit different current-voltage characteristics as solar cells.

A solar cell has inherent current-voltage characteristics, and the current and the voltage that correspond to the coordinates on a current-voltage characteristics curve, at which the value of voltage/current coincides with the resistance value of an external load, serve as the operating current and the operating voltage. In the case of an organic thin film solar cell, in a solar cell module having a plurality of photovoltaic cells connected in parallel, the voltage that corresponds to a coordinate on a current-voltage characteristic curve for the solar cell module, at which the value of voltage/current coincides with the resistance value of an external load, serves as the operating voltage of the solar cell module. Furthermore, the current obtainable at the operating voltage of the solar cell module in the coordinates on the current-voltage characteristic curve of each photovoltaic cell, serves as the operating current of each photovoltaic cell. Accordingly, when plural kinds of photovoltaic cells having different current-voltage characteristics are connected in parallel, in the photovoltaic cells having different current-voltage characteristics, the operating currents of the photovoltaic cells obtainable at the operating voltage of the solar cell module against the same resistance value of an external load do not coincide with one another.

Therefore, when plural kinds of photovoltaic cells having different current-voltage characteristics are connected in parallel, since the operating currents of the photovoltaic cells relative to the operating voltage of the solar cell module obtainable at a certain external resistance do not coincide with one another, there may be a problem that in a photovoltaic cell of a certain kind, the current flows in a forward direction, while in a photovoltaic cell of a different kind, the current flows in a backward direction. In this case, there is a problem that as photovoltaic cells in which the current flows in a backward direction are present, the operating current of the photovoltaic cells in which the current flows in a forward direction is reduced, and therefore, the power output characteristics of the solar cell module as a whole are deteriorated. Furthermore, since the current flow in a backward direction, there is a risk for heat generation or ignition, or there is a possibility of short circuit destruction.

Furthermore, when plural kinds of photovoltaic cells having different current-voltage characteristics are connected in parallel, as the photovoltaic cells having different current-voltage characteristics interfere with one another, there is a problem that the solar cell performance may deteriorate.

The present invention was achieved in view of the problems described above, and it is a main object of the present invention to provide an organic solar cell module and an organic solar cell panel, which has enhanced the design characteristics by using plural kinds of photoelectric conversion layers having different absorption wavelength regions, while are also capable of stably exhibiting satisfactory solar cell performance.

Solution to Problem

In order to achieve the object described above, the present invention provides an organic solar cell module comprising: a transparent substrate; a transparent electrode layer formed on the transparent substrate; a photoelectric conversion layer that is formed in a pattern on the transparent electrode layer and includes plural kinds of photoelectric conversion sections having different absorption wavelength regions; a plurality of back surface electrode layers respectively formed on the photoelectric conversion sections; an insulating layer that is formed so as to cover the plurality of back surface electrode layers and has an opening for each of the photoelectric conversion sections; and a plurality of charge-collecting wirings that are formed on the insulating layer and are disposed so as to be connected to the back surface electrode layers located at the openings of the insulating layer for the respective kinds of the photoelectric conversion sections.

According to the present invention, since the organic solar cell module comprises plural kinds of photoelectric conversion sections having different absorption wavelength regions, the organic solar cell module can be imparted with excellent design characteristics by disposing the plural kinds of photoelectric conversion sections so as to display an arbitrary pattern of characters, symbols, figures, shapes, and the like. Furthermore, according to the present invention, since an insulating layer having openings for each of the photoelectric conversion sections is formed on the back surface electrode layers, and a plurality of charge-collecting wirings are disposed to be connected to the back surface electrode layers located at the openings of the insulating layer for the respective kinds of the photoelectric conversion sections, electric power can be output to an external circuit for each kind of the photoelectric conversion sections, and thus the solar cell characteristics can be stably exhibited.

In the invention described above, it is preferable that the photoelectric conversion layer include a plurality of the photoelectric conversion sections of the same kinds; the openings of the insulating layer be disposed such that the back surface electrode layers formed on the photoelectric conversion sections of the same kind can be connected to one another by the charge-collecting wiring; and the charge-collecting wirings be disposed so as to respectively connect the back surface electrode layers that are located at the openings of the insulating layer provided on the photoelectric conversion sections of the same kind. When the photoelectric conversion layer includes a plurality of photoelectric conversion sections of the same kinds, electric power can be output to an external circuit for each kind of the photoelectric conversion sections by adopting such a configuration.

In the case as described above, it is preferable that the photoelectric conversion sections are regularly arranged; the openings of the insulating layer be disposed so as to be matched with the positions in the photoelectric conversion sections for the respective kinds of the photoelectric conversion sections; and the plurality of charge-collecting wirings be arranged in a stripe pattern. It is because the design of the openings of the insulating layer and the charge-collecting wirings is made easy.

Furthermore, according to the present invention, it is preferable that the organic solar cell module be an organic thin film solar cell module or a dye-sensitized solar cell module. It is because when the organic solar cell module is an organic thin film solar cell module or a dye-sensitized solar cell module, in which the photoelectric conversion sections have a varied color scheme, an organic solar cell module having excellent design characteristics can be obtained.

Furthermore, the present invention provides an organic solar cell panel comprising the organic solar cell module described above, and a plurality of voltage conversion sections respectively connected to the charge-collecting wirings for the respective kinds of the photoelectric conversion sections of the organic solar cell module.

According to the present invention, since the organic solar cell module comprises the organic solar cell module described above, excellent design characteristics can be imparted to the organic solar cell panel, and at the same time, electric power can be output to an external circuit for each kind of the photoelectric conversion sections, while solar cell characteristics can be stably exhibited.

Advantageous Effects of Invention

The present invention offers an effect that a multifunctional organic solar cell module having excellent design characteristics and having various display functions that can be utilized in promotion, advertisements and the like, can be realized. Furthermore, the present invention offers an effect that an organic solar cell module comprising a photoelectric conversion layer having plural kinds of photoelectric conversion sections having different absorption wavelength regions can stably exhibit solar cell characteristics.

DESCRIPTION OF EMBODIMENTS

Hereinafter, the organic solar cell module and the organic solar cell panel of the present invention will be described in detail.

I. Organic Solar Cell Module

The organic solar cell module of the present invention comprises: a transparent substrate; a transparent electrode layer formed on the transparent substrate; a photoelectric conversion layer that is formed in a pattern on the transparent electrode layer and includes plural kinds of photoelectric conversion sections having different absorption wavelength regions; a plurality of back surface electrode layers respectively formed on the photoelectric conversion sections; an insulating layer that is formed so as to cover the plurality of back surface electrode layers and has an opening for each of the photoelectric conversion sections; and a plurality of charge-collecting wirings that are formed on the insulating layer and are disposed so as to be connected to the back surface electrode layers located at the openings of the insulating layer for the respective kinds of the photoelectric conversion sections.

The organic solar cell module of the present invention will be described with reference to the drawings.

Figure 1:
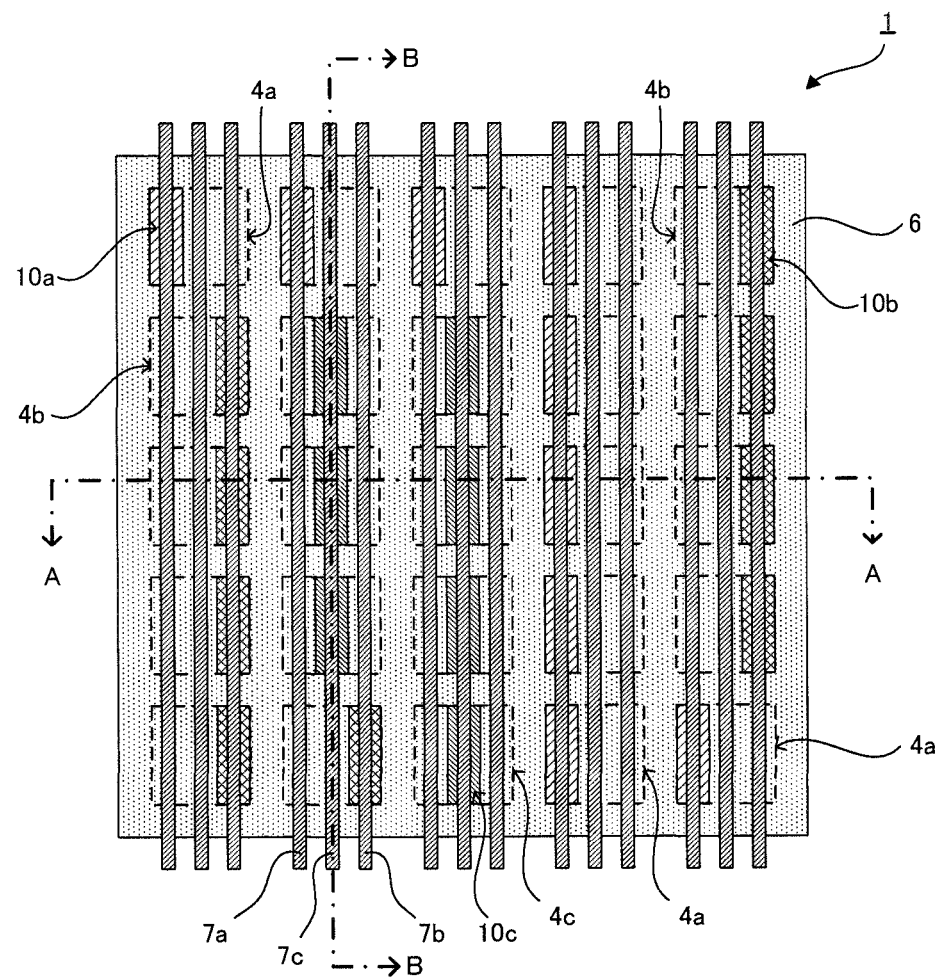
FIG. 1 is a schematic plan view illustrating an example of the organic solar cell module of the present invention.
Figure 2A:
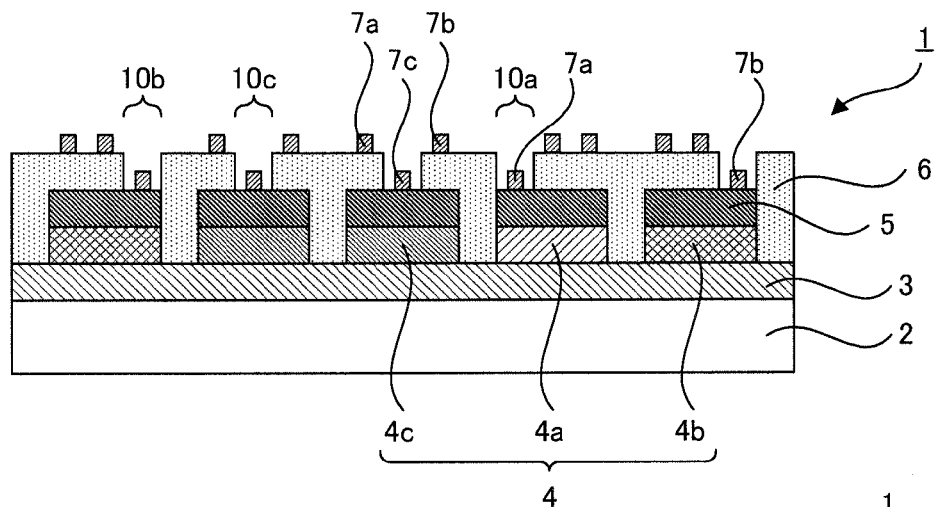
FIGS. 2A and 2B are each a cross-sectional view cut along the A-A line and a cross-sectional view cut along the B-B line of FIG. 1.
Figure 2B:
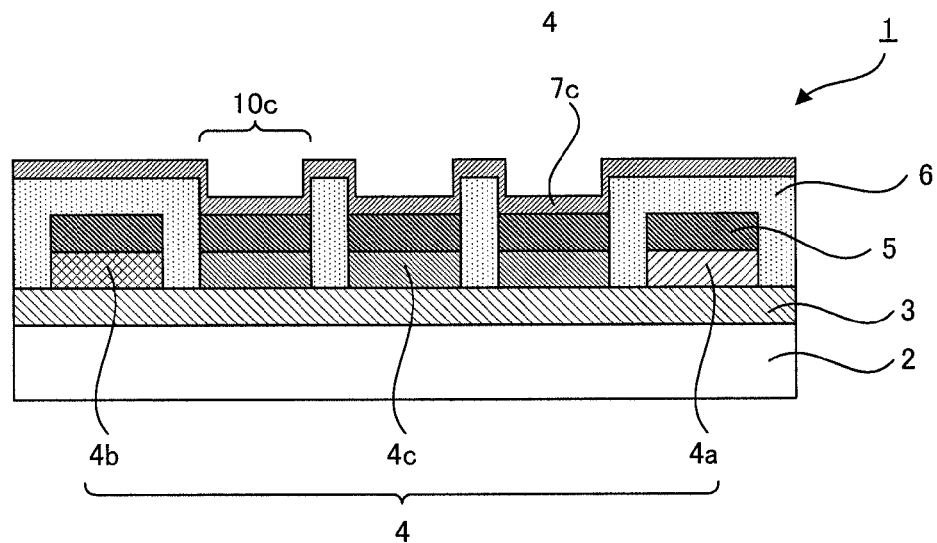

FIG. 1 is a schematic plan view illustrating an example of the organic solar cell module of the present invention, and FIG. 2A is a cross-sectional view cut along the A-A line of FIG. 1, while FIG. 2B is a cross-sectional view cut along the B-B line of FIG. 1. An organic solar cell module 1 illustrated in each of FIG. 1, FIG. 2A and FIG. 2B comprises: a transparent substrate 2; a transparent electrode layer 3 that is formed on the transparent substrate 2; a photoelectric conversion layer 4 that is formed in a pattern on the transparent electrode layer 3 and includes plural kinds of photoelectric conversion sections (4a, 4b, and 4c) having different absorption wavelength regions; a plurality of back surface electrode layers 5 respectively formed on the photoelectric conversion sections (4a, 4b, and 4c); an insulating layer 6 that is formed so as to cover the plurality of back surface electrode layers 5 and has openings (10a, 10b, and 10c) respectively for the photoelectric conversion sections (4a, 4b, and 4c); and a plurality of charge-collecting wirings (7a, 7b, and 7c) that are formed on the insulating layer 6 and are disposed so as to be connected to the back surface electrode layers 5 located at the openings (10a, 10b, and 10c) of the insulating layer 6 for the respective kinds of the photoelectric conversion sections (4a, 4b, and 4c). Incidentally, in FIG. 1, the back surface electrode layers are not depicted, and the photoelectric conversion sections are indicated by broken lines.

Figure 3:
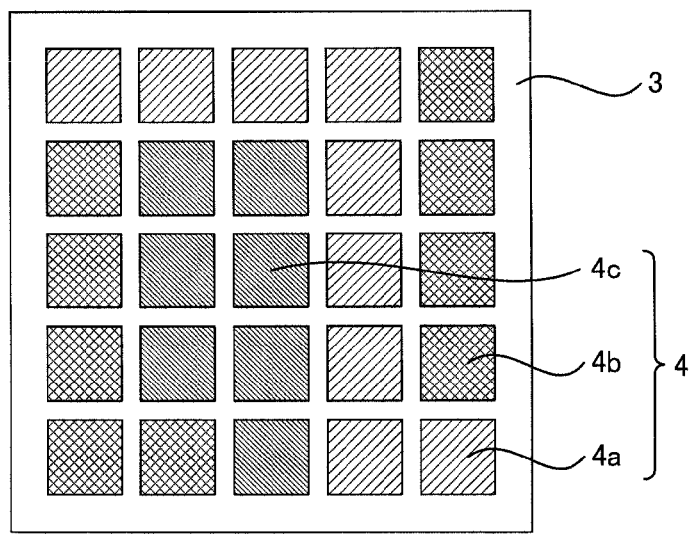
FIG. 3 is a schematic plan view illustrating an example of the photoelectric conversion layer in the organic solar cell module of the present invention.

The photoelectric conversion layer 4 includes, as illustrated in FIG. 3, a first photoelectric conversion section 4a, a second photoelectric conversion section 4b, and a third photoelectric conversion section 4c of three different kinds, which have different absorption wavelength regions, and the respective photoelectric conversion sections (4a, 4b, and 4c) are regularly arranged. Thus, the first photoelectric conversion section 4a, the second photoelectric conversion section 4b, and the third photoelectric conversion section 4c are disposed so as to display an arbitrary pattern.

Figure 4:
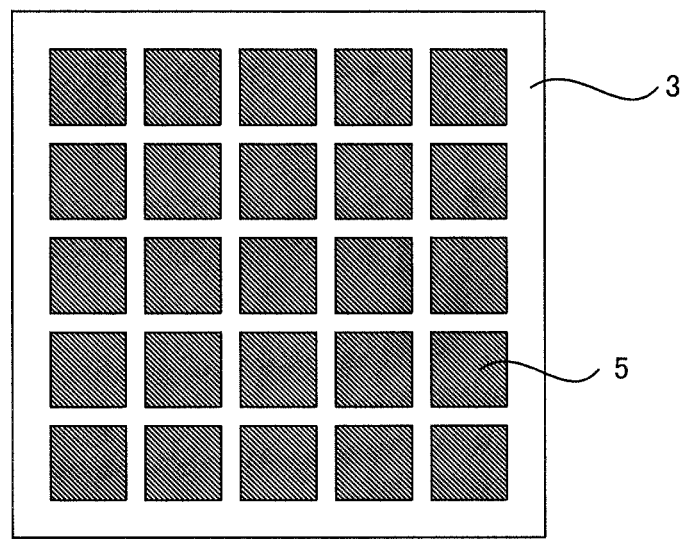
FIG. 4 is a schematic plan view illustrating an example of the back surface electrode layer in the organic solar cell module of the present invention.

The back surface electrode layers 5 are respectively formed on the photoelectric conversion sections (4a, 4b, and 4c), as illustrated in FIG. 4.

Figure 5:
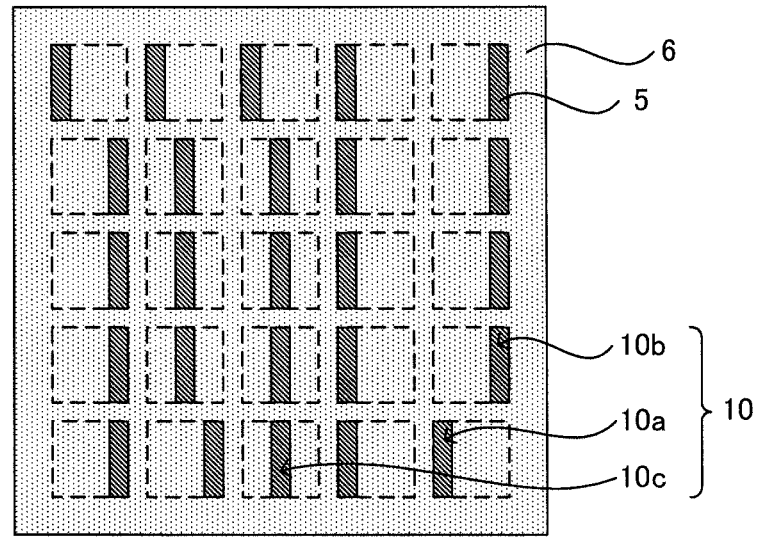
FIG. 5 is a schematic plan view illustrating an example of the insulating layer in the organic solar cell module of the present invention.

As illustrated in FIG. 5, the insulating layer 6 has an opening 10 for each of the photoelectric conversion sections (4a, 4b, and 4c), and as illustrated in each of FIG. 1, FIG. 2A, and FIG. 5, the opening 10a for the first photoelectric conversion section is disposed on the first photoelectric conversion section 4a, the opening 10b for the second photoelectric conversion section is disposed on the second photoelectric conversion section 4b, and the opening 10c for the third photoelectric conversion section is disposed on the third photoelectric conversion section 4c. These openings (10a, 10b, and 10c) of the insulating layer are disposed so as to be matched with the positions in the photoelectric conversion sections for the respective kinds of the photoelectric conversion sections. In each of FIG. 1, FIG. 2A and FIG. 5, in the first photoelectric conversion section 4a, rectangular opening 10a for first photoelectric conversion section is disposed such that the left portion of the square is opened; in the second photoelectric conversion section 4b, rectangular opening 10b for the second photoelectric conversion section is disposed such that the right portion of the square is opened; and in the third photoelectric conversion section 4c, rectangular opening 10c for the third photoelectric conversion section is disposed such that the central portion of the square is opened. Incidentally, in FIG. 5, the photoelectric conversion sections are indicated by broken lines.

The charge-collecting wirings (7a, 7b, and 7c) are disposed so as to respectively connect the back surface electrode layers that are located at the openings of the insulating layer provided on the photoelectric conversion sections of the same kind, with one another. In each of FIG. 1 and FIG. 2A, in the first photoelectric conversion section 4a, the charge-collecting wiring 7a for the first photoelectric conversion sections is disposed so as to connect the back surface electrode layers 5 that are located at the openings 10a for the first photoelectric conversion sections provided on the first photoelectric conversion sections 4a arrayed vertically in a row, with one another; in the second photoelectric conversion section 4b, the charge-collecting wiring 7b for the second photoelectric conversion sections is disposed so as to connect the back surface electrode layers 5 that are located at the openings 10b for the second photoelectric conversion sections provided on the second photoelectric conversion section 4b arrayed vertically in a row, with one another; and in the third photoelectric conversion section 4c, the charge-collecting wiring 7c for the third photoelectric conversion sections is disposed so as to connect the back surface electrode layers 5 that are located at the openings 10c for the third photoelectric conversion sections provided on the third photoelectric conversion section 4c arrayed vertically in a row, with one another. As illustrated in FIG. 1, the charge-collecting wirings (7a, 7b, and 7c) of the same number (3 in FIG. 1) as the number of kinds of the photoelectric conversion sections (3 kinds in FIG. 1) are disposed in a stripe pattern on the photoelectric conversion sections (4a, 4b, and 4c), in each of the vertical rows of the photoelectric conversion sections (4a, 4b, and 4c).

Since the light absorbed by a photoelectric conversion section and the light transmitted thereby are in a mutually complementary color relationship, if the absorption wavelength regions of the photoelectric conversion sections differ from each other, the transmission wavelength regions differ from each other, and the observed colors differ from each other. Therefore, in the organic solar cell module 1 illustrated in each of FIG. 1, FIG. 2A and FIG. 2B, an arbitrary pattern composed of plural kinds of photoelectric conversion sections (4a, 4b, and 4c) illustrated in FIG. 3 can be displayed on the light-receiving surface (on the side of the transparent substrate 2), a full-colored organic solar cell can be produced, and excellent design characteristics can be imparted. Furthermore, electric power can be output to an external circuit for each kind of the photoelectric conversion sections (4a, 4b, and 4c).

Figure 6A:
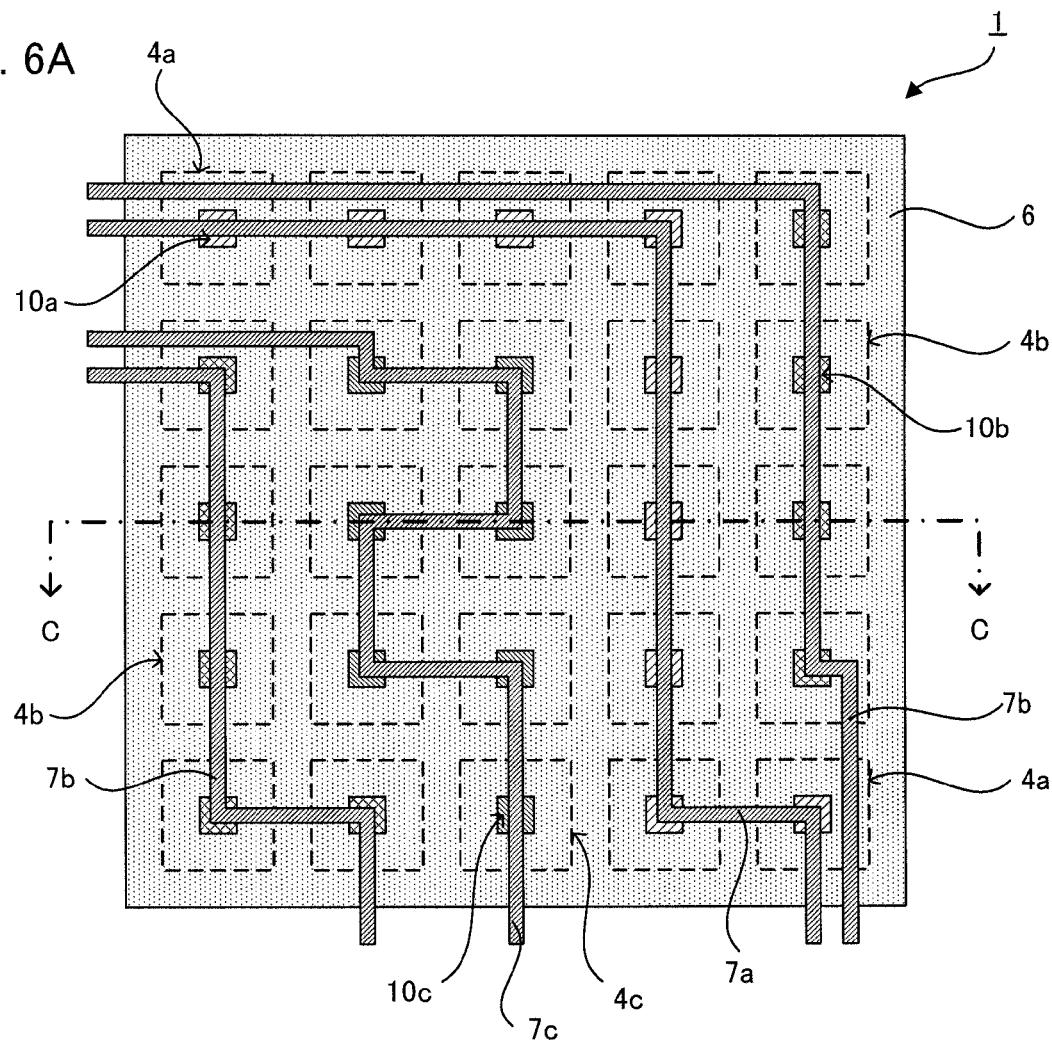
FIGS. 6A and 6B are each a schematic plan view and a cross-sectional view illustrating another example of the organic solar cell module of the present invention.
Figure 6B:
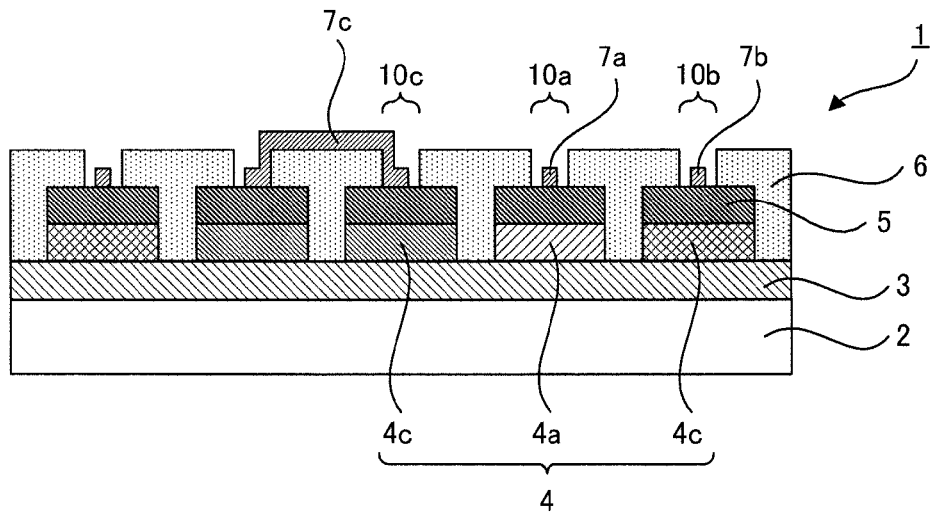

FIG. 6A and FIG. 6B are a schematic plan view and a cross-sectional view illustrating another example of the organic solar cell module of the present invention, and FIG. 6B is a cross-sectional view cut along the C-C line of FIG. 6A. The organic solar cell module 1 illustrated in each of FIG. 6A and FIG. 6B comprises a transparent substrate 2; a transparent electrode layer 3 formed on the transparent substrate 2; a photoelectric conversion layer 4 that is formed in a pattern on the transparent electrode layer 3 and includes plural of kinds of photoelectric conversion sections (4a, 4b, and 4c) having different absorption wavelength regions; a plurality of back surface electrode layers 5 respectively formed on the photoelectric conversion sections (4a, 4b, and 4c); an insulating layer 6 that is formed so as to cover the plurality of back surface electrode layers 5 and has openings (10a, 10b, and 10c) respectively for the photoelectric conversion sections (4a, 4b, and 4c); and a plurality of charge-collecting wirings (7a, 7b, and 7c) that are formed on the insulating layer 6 and are disposed so as to be connected to the back surface electrode layers 5 located at the openings (10a, 10b, and 10c) of the insulating layer 6 for the respective kinds of the photoelectric conversion sections (4a, 4b, and 4c). Incidentally, in FIG. 6A, the back surface electrode layers are not depicted, and the photoelectric conversion sections are indicated by broken lines.

The photoelectric conversion layer 4 includes, as illustrated in FIG. 3, a first photoelectric conversion section 4a, a second photoelectric conversion section 4b, and a third photoelectric conversion section 4c of three different kinds, which have different absorption wavelength regions, and the respective photoelectric conversion sections (4a, 4b, and 4c) are regularly arranged. Thus, the first photoelectric conversion section 4a, the second photoelectric conversion section 4b, and the third photoelectric conversion section 4c are disposed so as to display an arbitrary pattern.

The back surface electrode layers 5 are respectively formed on the photoelectric conversion sections (4a, 4b, and 4c), as illustrated in FIG. 4.

The insulating layer 6 has openings (10a, 10b, and 10c) respectively for the photoelectric conversion sections (4a, 4b, and 4c), and as illustrated in FIG. 6A and FIG. 6B, the opening 10a for the first photoelectric conversion section is disposed on the first photoelectric conversion section 4a, the opening 10b for the second photoelectric conversion section is disposed on the second photoelectric conversion section 4b, and the opening 10c for the third photoelectric conversion section is disposed on the third photoelectric conversions section 4c. These openings (10a, 10b, and 10c) of the insulating layer 6 are disposed so as to be matched with the positions in the photoelectric conversion sections for the respective photoelectric conversion sections, and in the respective photoelectric conversion sections, square-shaped openings (10a, 10b, and 10c) are disposed such that the central portion of the square is opened.

The charge-collecting wirings (7a, 7b, and 7c) are disposed so as to respectively connect the back surface electrode layers that are located at the openings of the insulating layer provided on the photoelectric conversion sections of the same kind, with one another. In the first photoelectric conversion section 4a, one charge-collecting wiring 7a for the first photoelectric conversion sections is disposed so as to connect all the back surface electrode layers that are located at the openings 10a for the first photoelectric conversion sections provided on the first photoelectric conversion sections 4a, with one another; in the third photoelectric conversion section 4c, one charge-collecting wiring 7c for the third photoelectric conversion section is disposed so as to connect all the back surface electrode layers 5 that are located at the openings 10c for the third photoelectric conversion sections provided on the third photoelectric conversion sections 4c; and in the second photoelectric conversion section 4b, two charge-collecting wirings 7b for the second photoelectric conversion sections are disposed so as to connect the back surface electrode layers 5 that are located at the openings 10b for the second photoelectric conversion sections provided on the second photoelectric conversion sections 4b that are disposed on the right side of the organic solar cell module 1, and to connect the back surface electrode layers 5 that are located at the openings 10b for the second photoelectric conversion sections provided on the second photoelectric conversion sections 4b that are disposed on the left side of the organic solar cell module 1.

The organic solar cell module 1 illustrated in each of FIG. 6A and FIG. 6B can also display, similarly to the organic solar cell module 1 illustrated in FIG. 1, the arbitrary pattern composed of plural kinds of photoelectric conversion sections (4a, 4b, and 4c) illustrated in FIG. 3, on the light-receiving surface (on the side of the transparent substrate 2), and excellent design characteristics can be imparted. Furthermore, electric power can be output to an external circuit for each kind of the photoelectric conversion sections (4a, 4b, and 4c).

Figure 7A:
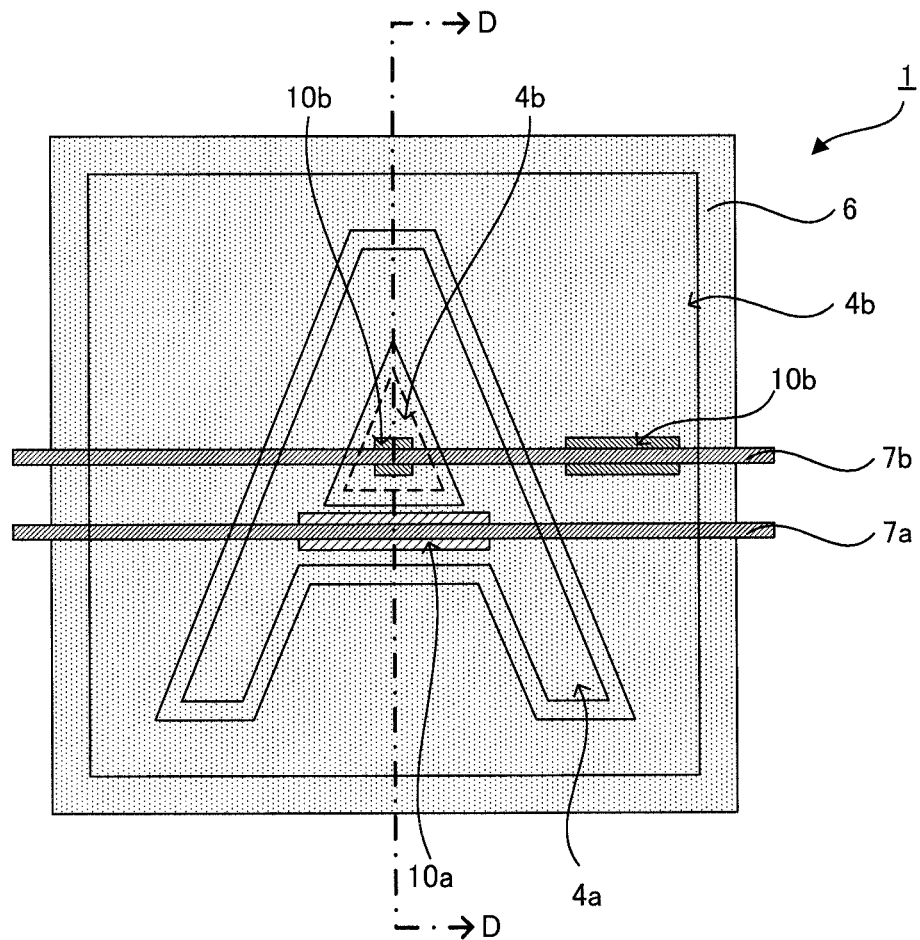
FIGS. 7A and 7B are each a schematic plan view and a cross-sectional view illustrating another example of the organic solar cell module of the present invention.
Figure 7B:
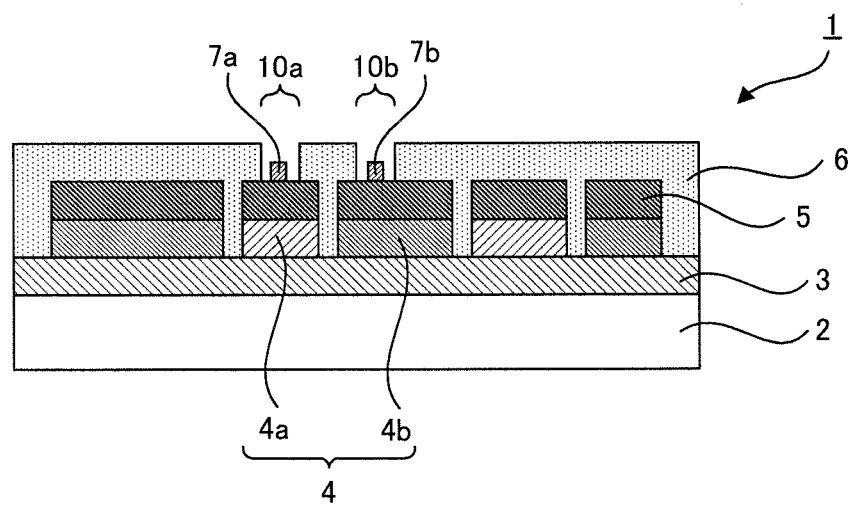

FIG. 7A and FIG. 7B are a schematic plan view and a cross-sectional view illustrating another example of the organic solar cell module of the present invention, and FIG. 7B is a cross-sectional view cut along the D-D line of FIG. 7A. The organic solar cell module 1 illustrated in each of FIG. 7A and FIG. 7B comprises: a transparent substrate 2; a transparent electrode layer 3 formed on the transparent substrate 2; a photoelectric conversion layer 4 that is formed in a pattern on the transparent electrode layer 3 and includes plural kinds of photoelectric conversion sections (4a and 4b) having different absorption wavelength regions; a plurality of back surface electrode layers 5 respectively formed on the photoelectric conversion sections (4a and 4b); an insulating layer 6 that is formed so as to cover the plurality of back surface electrode layers 5 and has openings (10a and 10b) respectively for the photoelectric conversion sections (4a and 4b); and a plurality of charge-collecting wirings (7a and 7b) that are formed on the insulating layer 6 and are disposed so as to be connected to the back surface electrode layers 5 located at the openings (10a and 10b) of the insulating layer 6 for the respective kinds of the photoelectric conversion sections (4a and 4b). Incidentally, in FIG. 7A, the back surface electrode layers are not depicted, and the photoelectric conversion sections are indicated by broken lines.

Figure 8A:
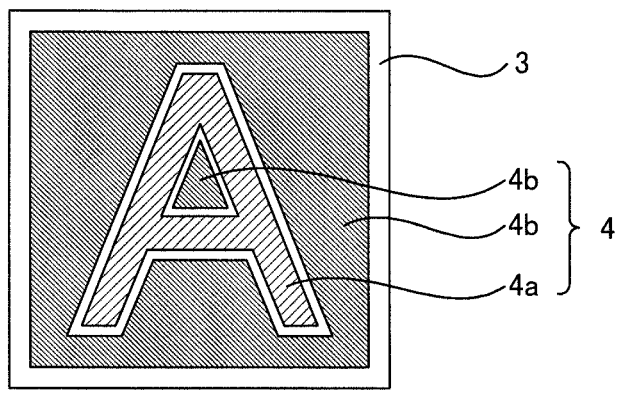
FIGS. 8A and 8B are each a schematic plan view illustrating another example of the photoelectric conversion layer and the back surface electrode layer in the organic solar cell module of the present invention.

The photoelectric conversion layer 4 includes, as illustrated in FIG. 8A, two different kinds of a first photoelectric conversion section 4a and a second photoelectric conversion section 4b having different absorption wavelength regions, and the first photoelectric conversion section 4a and the second photoelectric conversion section 4b are disposed so as to display the letter "A".

Figure 8B:
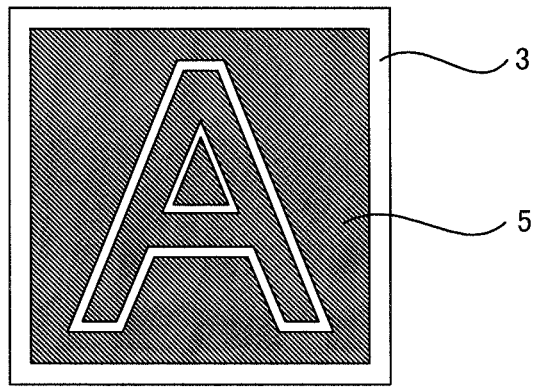

The back surface electrode layers 5 are respectively formed on the photoelectric conversion sections (4a and 4b), as illustrated in FIG. 8B.

As illustrated in FIG. 7A and FIG. 7B, the insulating layer 6 has openings (10a and 10b) respectively for the photoelectric conversion sections (4a and 4b), and the opening 10a for the first photoelectric conversion section is disposed on the first photoelectric conversion section 4a, while the opening 10b for the second photoelectric conversion section is disposed on the second photoelectric conversion section 4b.

The charge-collecting wirings (7a and 7b) are disposed, as illustrated in FIG. 7A and FIG. 7B, so as to be connected to the back surface electrode layers that are located at the openings of the insulating layer for the respective kinds of the photoelectric conversion sections. In the first photoelectric conversion section 4a, the charge-collecting wiring 7a for the first photoelectric conversion section is disposed so as to be connected to the back surface electrode layer 5 that is located at the opening 10a for the first photoelectric conversion section provided on the first photoelectric conversion section 4a, and in the second photoelectric conversion section 4b, the charge-collecting wiring 7b for the second photoelectric conversion section is disposed so as to connect the back surface electrode layers 5 that are located at the openings 10b for the second photoelectric conversion sections provided on two second photoelectric conversion sections 4b, with one another.

As discussed above, since the light absorbed by the photoelectric conversion sections and the light transmitted by the photoelectric conversion sections are in a mutually complementary color relationship, if the absorption wavelength regions of the photoelectric conversion sections differ from each other, the transmission wavelength regions differ from each other, and the displayed colors differ from each other. Therefore, the organic solar cell module 1 illustrated in each of FIG. 7A and FIG. 7B can display the letter "A" illustrated in FIG. 8A with a variety of colors on the light-receiving surface (on the side of the transparent substrate 2), and excellent design characteristics can be imparted. Furthermore, electric power can be output to an external circuit for each kind of the photoelectric conversion sections (4a and 4b).

As such, in the present invention, when plural kinds of photoelectric conversion sections having different absorption wavelength regions are disposed such that an arbitrary pattern of characters, symbols, figures, shapes and the like is displayed, an arbitrary pattern of characters, symbols, figures, shapes and the like can be displayed with a variety of colors on the light-receiving surface (on the side of the transparent substrate), and a display function can be imparted. Therefore, an organic solar cell module which has a rich color tone, has a display function, and has excellent design characteristics can be produced.

Furthermore, since an insulating layer having an opening for each of the photoelectric conversion sections is formed on the back surface electrode layers, and a plurality of charge-collecting wirings are disposed so as to be connected to the back surface electrode layers located at the openings of the insulating layer for the respective kinds of the photoelectric conversion sections, electric power can be output to an external circuit for each kind of the photoelectric conversion sections. Also, photovoltaic cells having different current-voltage characteristics are prevented from interfering with each other, and solar cell characteristics can be stably exhibited. Furthermore, safety of the organic solar cell module can also be secured.

Furthermore, in a silicon-based solar cell, since the band gap is fixed, it is difficult to impart design characteristics by using plural kinds of photoelectric conversion sections having different absorption wavelength regions. On the contrary, in an organic solar cell, the absorption wavelength region can be adjusted by addition, deletion and substitution of an electron-withdrawing group or an electron-donating group in the chemical structure of the organic material used in the photoelectric conversion sections, and thus excellent design characteristics can be imparted.

The organic solar cell module of the present invention is not particularly limited as long as it is a solar cell module using an organic material in the photoelectric conversion layer, but specifically, an organic thin film solar cell module or a dye-sensitized solar cell module is preferred. Hereinafter, the present invention will be described in parts such as an embodiment in which the organic solar cell module of the present invention is an organic thin film solar cell module (hereinafter, referred to as a first embodiment) and an embodiment in which the organic solar cell module of the present invention is a dye-sensitized solar cell module (hereinafter, referred to as a second embodiment).

A. First Embodiment

The organic solar cell module of the present embodiment is an organic thin film solar cell module.

Hereinafter, various configurations of the organic thin film solar cell module of the present embodiment will be described.

1. Insulating Layer

The insulating layer in the present embodiment is formed so as to cover a plurality of back surface electrode layers, and has an opening for each of the photoelectric conversion sections.

Incidentally, the phrase "the insulating layer has an opening for each of the photoelectric conversion sections" implies that openings are respectively provided on all of the photoelectric conversion sections that constitute the photoelectric conversion layer.

In regard to the disposition of the openings of the insulating layer, there are no particular limitations if the openings are provided respectively for the photoelectric conversion sections, and the charge-collecting wirings that are connected to the back surface electrode layer formed on the photoelectric conversion sections of different kinds, are disposed so as not to be in contact with each other. The disposition is appropriately selected in accordance with the shape, size, disposition and the like of the photoelectric conversion sections that display an intended arbitrary pattern of characters, symbols, figures, shapes and the like. For example, as illustrated in each of FIG. 1 and FIG. 6A, the openings (10a, 10b, and 10c) of the insulating layer may be regularly provided, or as illustrated in FIG. 7A, the openings (10a and 10b) of the insulating layer may be irregularly provided.

Among others, in the case where the photoelectric conversion layer has a plurality of photoelectric conversion sections of the same kinds, it is preferable that the openings of the insulating layer be disposed such that the back surface electrode layers formed on the photoelectric conversion sections of the same kinds can be respectively connected by the charge-collecting wirings. For example, in each of FIG. 1, FIG. 2A and FIG. 2B, the photoelectric conversion layer 4 includes a plurality of the first photoelectric conversion sections 4a, the second photoelectric conversion sections 4b, and the third photoelectric conversion sections 4c, respectively. The openings 10a for the first photoelectric conversion sections are disposed such that the openings can connect the back surface electrode layers 5 formed on the first photoelectric conversion sections 4a by means of the charge-collecting wiring 7a for the first photoelectric conversion sections, the openings 10b for the second photoelectric conversion sections are disposed such that the openings can connect the back surface electrode layers 5 formed on the second photoelectric conversion sections 4b by means of the charge-collecting wirings 7b for the second photoelectric conversion sections, and the openings 10c for the third photoelectric conversion sections are disposed such that the openings can connect the back surface electrode layers 5 formed on the third photoelectric conversion sections 4c by means of the charge-collecting wirings 7c for the third photoelectric conversion sections. Also in each of FIG. 6A and FIG. 6B, the photoelectric conversion layer 4 includes a plurality of the first photoelectric conversion sections 4a, the second photoelectric conversion sections 4b, and the third photoelectric conversion sections 4c, respectively. The openings 10a for the first photoelectric conversion sections are disposed such that the openings can connect the back surface electrode layers 5 formed on the first photoelectric conversion sections 4a by means of the charge-collecting wiring 7a for the first photoelectric conversion sections, the openings 10b for the second photoelectric conversion sections are disposed such that the openings can connect the back surface electrode layers 5 formed on the second photoelectric conversion sections 4b by means of the charge-collecting wirings 7b for the second photoelectric conversion sections, and the openings 10c for the third photoelectric conversion sections are disposed such that the openings can connect the back surface electrode layers 5 formed on the third photoelectric conversion sections 4c by means of the charge-collecting wirings 7c for the third photoelectric conversion sections. Furthermore, for example, in each of FIG. 7A and FIG. 7B, the photoelectric conversion layer 4 includes a plurality of the second photoelectric conversion sections 4b, and the openings 10b for the second photoelectric conversion sections are disposed such that the openings can connect the back surface electrode layers 5 formed on the second photoelectric conversion sections 4b by means of the charge-collecting wirings 7b for the second photoelectric conversion sections. As such, as the openings of the insulating layer are disposed such that the openings can connect the back surface electrode layers formed on the photoelectric conversion sections of the same kind respectively by means of the charge-collecting wirings, electric power can be output to an external circuit for the respective kinds of the photoelectric conversion sections.

In the case described above, the disposition of the openings of the insulating layer is not particularly limited, as long as the openings of the insulating layer are disposed such that the openings can connect the back surface electrode layers formed on the photoelectric conversion sections of the same kinds respectively by means of charge-collecting wirings, and the openings are disposed such that the charge-collecting wirings that are connected to the back surface electrode layers formed on the photoelectric conversion sections of different kinds are not brought into contact. For example, as illustrated in FIG. 1, the openings (10a, 10b, and 10c) of the insulating layer may be regularly provided for the respective kinds of the photoelectric conversion sections (4a, 4b, and 4c); as illustrated in FIG. 6A, the openings (10a, 10b, and 10c) of the insulating layer may be regularly provided for the respective kinds of the photoelectric conversion sections (4a, 4b, and 4c); or as illustrated in FIG. 7A, the openings (10a and 10b) of the insulating layer may be irregularly provided.

Furthermore, in the case where the photoelectric conversion layer includes a plurality of photoelectric conversion sections of the same kinds, and the photoelectric conversion sections are regularly arranged, as described above, the disposition of the openings of the insulating layer is not particularly limited, as long as the openings of the insulating layer are disposed such that the openings can connect the back surface electrode layers formed on the photoelectric conversion sections of the same kinds respectively by means of the charge-collecting wirings, and the openings are disposed such that the charge-collecting wirings that are connected to the back surface electrode layers formed on the photoelectric conversion sections of different kinds are not brought into contact. For example, as illustrated in FIG. 1, the openings (10a, 10b, and 10c) of the insulating layer may also be disposed such that the openings are matched with the positions in the photoelectric conversion sections (4a, 4b, and 4c) for the respective kinds of the photoelectric conversion sections (4a, 4b, and 4c). In FIG. 1, in the first photoelectric conversion sections 4a, rectangular openings 10a for the first photoelectric conversion sections are disposed such that the left portion of the square is opened; in the second photoelectric conversion sections 4b, rectangular openings 10b for the second photoelectric conversion sections are disposed such that the right portion of the square is opened; and in the third photoelectric conversion sections 4c, rectangular openings 10c for the third photoelectric conversion sections are disposed such that the central portion of the square is opened. Furthermore, for example, as illustrated in each of FIG. 6A, the openings (10a, 10b, and 10c) of the insulating layer may be disposed such that the openings are matched with the positions in the photoelectric conversion sections (4a, 4b, and 4c) for the respective photoelectric conversion sections (4a, 4b, and 4c). In FIGS. 6A and 6B, in all the photoelectric conversion sections (4a, 4b, and 4c), square-shaped openings (10a, 10b, and 10c) are disposed such that the central portion of the square is opened.

Among others, when the photoelectric conversion sections are regularly arranged, it is preferable that the openings of the insulating layer be disposed such that the openings are matched with the positions in the photoelectric conversion sections for the respective kinds of the photoelectric conversion sections. In this case, particularly, it is preferable that the openings of the insulating layer be disposed within a single region when the photoelectric conversion sections are partitioned into the same number of regions as the number of kinds of the photoelectric conversion sections in a direction perpendicular to the longitudinal direction of the charge-collecting wirings, and it is more preferable that the openings be disposed such that the openings constitute a single region when the photoelectric conversion sections are partitioned into the same number of regions as the number of kinds of the photoelectric conversion sections in a direction perpendicular to the longitudinal direction of the charge-collecting wirings. For example, in FIG. 1, the photoelectric conversion layer 4 includes three kinds of photoelectric conversion sections (4a, 4b, and 4c), and the openings (10a, 10b, and 10c) of the insulating layer are disposed so as to constitute a single region when the respective photoelectric conversion sections (4a, 4b, and 4c) are partitioned into three regions in a direction perpendicular (horizontal direction in FIG. 1) to the longitudinal direction (vertical direction in FIG. 1) of the charge-collecting wirings (7a, 7b, and 7c). When the openings of the insulating layer are disposed as such, the charge-collecting wirings can be disposed in a straight line form for the respective kinds of the photoelectric conversion sections. Therefore, the design of the openings of the insulating layer and the charge-collecting wirings is made easy.

When the photoelectric conversion sections are partitioned into the same number of regions as the number of kinds of the photoelectric conversion sections in a direction perpendicular to the longitudinal direction of the charge-collecting wirings, it is preferable to divide the photoelectric conversion sections in equal proportions, in order to make the design of the openings of the insulating layer and the charge-collecting wirings easier.

The size of the openings of the insulating layer is not particularly limited, as long as the openings can be disposed on the photoelectric conversion sections, an electrical connection between the back surface electrode layers located at the openings of the insulating layer and the charge-collecting wirings is enabled, and the openings can be disposed such that the charge-collecting wirings that are connected to the back surface electrode layers formed on the photoelectric conversion sections of different kinds are not brought into contact. The size is appropriately selected in accordance with the disposition of the openings of the insulating layer; and the shape, size, disposition and the like of the photoelectric conversion sections that display an intended arbitrary pattern. If the openings of the insulating layer are large, the disposition of the charge-collecting wirings may become difficult, and if the openings of the insulating layer are small, the disposition of the charge-collecting wirings is made easy, while there is a risk that the reliability of the electrical connection of the back surface electrode layer and the charge-collecting wirings may decrease.

The size of the openings of the insulating layer may be identical or may be different for the respective photoelectric conversion sections. For example, in FIG. 1 and FIG. 6A, the size of the openings (10a, 10b, and 10c) of the insulating layer is the same in all of the photoelectric conversion sections (4a, 4b, and 4c). On the other hand, in FIG. 7A, the size of the openings (10a and 10b) of the insulating layer varies in the respective photoelectric conversion sections (4a and 4b).

Among others, in the case where the photoelectric conversion sections are regularly arranged, the size of the openings of the insulating layer is preferably of the same extent as the size of a single region when the photoelectric conversion sections are partitioned into the same number of regions as the number of kinds of the photoelectric conversion sections in a direction perpendicular to the longitudinal direction of the charge-collecting wirings, or less than or equal to the size of the single region described above. Particularly, it is preferable that the size be of the same extent as the size of the single region described above. It is because, as discussed above, when the openings of the insulating layer are adjusted to such a size, the charge-collecting wirings can be disposed in a straight line form respectively for the kinds of the photoelectric conversion sections, and the design of the openings of the insulating layer and the charge-collecting wirings is made easy.

When the photoelectric conversion sections are partitioned into the same number of regions as the number of kinds of the photoelectric conversion sections in a direction perpendicular to the longitudinal direction of the charge-collecting wirings, as described above, it is preferable to divide the photoelectric conversion sections in equal proportions, in order to make the design of the openings of the insulating layer and the charge-collecting wirings easier.

There are no particular limitations on the shape of the openings of the insulating layer, and for example, the shape can be made into a rectangular shape, a polygonal shape, a circular shape, or the like.

The material used in the insulating layer is not particularly limited as long as it is a material which has insulating properties and is capable of forming an insulating layer having intended openings, and any general insulating material can be used. The insulating material may or may not have transparency. Examples of the insulating material include organic insulating materials such as polyesters, epoxy resins, melamine resins, phenolic resins, polyurethane, silicone resins, polyethylene, polyvinyl chloride, acrylic resins, and cardo resins; and inorganic insulating materials such as silicon oxide and silicon nitride.

The method for forming the insulating layer is not particularly limited as long as it is a method capable of forming an insulating layer having intended openings, and wet methods and dry methods can both be used. Examples thereof include printing methods such as gravure coating and screen printing, deposition methods, and photolithographic methods.

The film thickness of the insulating layer is not particularly limited as long as it is a thickness which is capable of insulating the back surface electrode layers and the charge-collecting wirings through the insulating layer.

2. Charge-Collecting Wirings

The charge-collecting wirings in the present embodiment are formed on the insulating layer, and are disposed so as to be connected to the back surface electrode layers that are located at the openings of the insulating layer for the respective kinds of the photoelectric conversion sections. The charge-collecting wirings are formed in a plural number.

Incidentally, the phrase "the charge-collecting wirings are disposed so as to be connected to the back surface electrode layers that are located at the openings of the insulating layer for the respective kinds of the photoelectric conversion sections" implies that at least the same number of charge-collecting wirings as the number of kinds of the photoelectric conversion sections are formed on the insulating layer, and these charge-collecting wirings are disposed so as to be connected to the back surface electrode layers that are located at the openings of the insulating layer provided on the photoelectric conversion sections for the respective kinds of the photoelectric conversion sections.

In regard to the disposition of the charge-collecting wirings, there are no particular limitations as long as the charge-collecting wirings are disposed so as to be connected to the back surface electrode layer that are located at the openings of the insulating layer for the respective kinds of the photoelectric conversion sections, and the charge-collecting wirings are disposed such that the charge-collecting wirings that are connected to the back surface electrode layers formed on the photoelectric conversion sections of different kinds are not brought into contact. The disposition is appropriately selected in accordance with the shape, size, disposition and the like of the photoelectric conversion sections that display an intended arbitrary pattern; and the shape, size, disposition and the like of the openings of the insulating layer. For example, as illustrated in FIG. 1, the charge-collecting wirings (7a, 7b, and 7c) may be regularly disposed, or as illustrated in FIG. 6A and FIG. 7A, the charge-collecting wirings (7a, 7b, and 7c, or 7a and 7b) may be irregularly disposed.

Among others, when the photoelectric conversion layer includes a plurality of photoelectric conversion sections of the same kinds, it is preferable that the charge-collecting wirings be disposed so as to respectively connect the back surface electrode layers that are located at the openings of the insulating layer provided on the photoelectric conversion sections of the same kind. For example, in each of FIG. 1, FIG. 2A and FIG. 2B, the photoelectric conversion layer 4 includes a plurality of the first photoelectric conversion sections 4a, the second photoelectric conversion sections 4b, and the third photoelectric conversion sections 4c, respectively. The charge-collecting wirings 7a for the first photoelectric conversion sections are disposed so as to connect the back surface electrode layers 5 that are located at the openings 10a for the first photoelectric conversion sections provided on the first photoelectric conversion sections 4a; the charge-collecting wirings 7b for the second photoelectric conversion sections are disposed so as to connect the back surface electrode layers 5 that are located at the openings 10b for the second photoelectric conversion sections provided on the second photoelectric conversion sections 4b; and the charge-collecting wirings 7c for the third photoelectric conversion sections are disposed so as to connect the back surface electrode layers 5 that are located at the openings 10c for the third photoelectric conversion sections provided on the third photoelectric conversion sections 4c. Also in each of FIG. 6A and FIG. 6B, the photoelectric conversion layer 4 includes a plurality of the first photoelectric conversion sections 4a, the second photoelectric conversion sections 4b, and the third photoelectric conversion sections 4c, respectively. The charge-collecting wirings 7a for the first photoelectric conversion sections are disposed so as to connect the back surface electrode layers 5 that are located at the openings 10a for the first photoelectric conversion sections provided on the first photoelectric conversion sections 4a; the charge-collecting wirings 7b for the second photoelectric conversion sections are disposed so as to connect the back surface electrode layers 5 that are located at the openings 10b for the second photoelectric conversion sections provided on the second photoelectric conversion sections 4b; and the charge-collecting wirings 7c for the third photoelectric conversion sections are disposed so as to connect the back surface electrode layers 5 that are located at the openings 10c for the third photoelectric conversion sections provided on the third photoelectric conversion sections 4c. Furthermore, for example, in each of FIG. 7A and FIG. 7B, the photoelectric conversion layer 4 includes a plurality of the second photoelectric conversion sections 4b, and the charge-collecting wirings 7b for the second photoelectric conversion sections are disposed so as to connect the back surface electrode layers 5 that are located at the openings 10b for the second photoelectric conversion sections provided on the second photoelectric conversion sections 4b. As such, when the charge-collecting wirings are disposed so as to respectively connect the back surface electrode layers that are located at the openings of the insulating layer provided on the photoelectric conversion sections of the same kind, electric power can be output to an external circuit for the respective kinds of the photoelectric conversion sections.

In the case as described above, the disposition of the charge-collecting wirings is not particularly limited, as long as the charge-collecting wirings are disposed so as to respectively connect the back surface electrode layers that are located at the openings of the insulating layer provided on the photoelectric conversion sections of the same kind, and the charge-collecting wirings are disposed such that the charge-collecting wirings that are connected to the back surface electrode layers formed on the photoelectric conversion sections of different kinds are not brought into contact. For example, as illustrated in FIG. 1, the charge-collecting wirings (7a, 7b, and 7c) may be regularly disposed, and as illustrated in each of FIG. 6A and FIG. 7A, the charge-collecting wirings (7a, 7b, and 7c, or 7a and 7b) may be irregularly disposed.

Furthermore, in the case where the photoelectric conversion layer includes a plurality of the photoelectric conversion sections of the same kinds, and the photoelectric conversion sections are regularly arranged, as described above, the disposition of the charge-collecting wirings is not particularly limited, as long as the charge-collecting wirings are disposed so as to respectively connect the back surface electrode layers that are located at the openings of the insulating layer provided on the photoelectric conversion sections of the same kind, and the charge-collecting wirings are disposed such that the charge-collecting wirings that are connected to the back surface electrode layers formed on the photoelectric conversion sections of different kinds are not brought into contact. For example, as illustrated in FIG. 1, the charge-collecting wirings (7a, 7b, and 7c) may be regularly disposed, or as illustrated in FIG. 6A, the charge-collecting wirings (7a, 7b, and 7c) may be irregularly disposed. For example, in each of FIG. 1, FIG. 2A and FIG. 2B, the charge-collecting wirings 7a for the first photoelectric conversion sections are disposed so as to connect the back surface electrode layers 5 that are located at the openings 10a for the first photoelectric conversion sections provided on the first photoelectric conversion sections 4a vertically in a row; the charge-collecting wirings 7b for the second photoelectric conversion sections are disposed so as to connect the back surface electrode layers 5 that are located at the openings 10b for the second photoelectric conversion sections provided on the second photoelectric conversion sections 4b vertically in a row; and the charge-collecting wirings 7c for the third photoelectric conversion sections are disposed so as to connect the back surface electrode layers 5 that are located at the openings 10c for the third photoelectric conversion sections provided on the third photoelectric conversion sections 4c vertically in a row. In each of the vertical rows of the photoelectric conversion sections (4a, 4b, and 4c), three charge-collecting wirings such as a charge-collecting wiring 7a for the first photoelectric conversion sections, a charge-collecting wiring 7b for the second photoelectric conversion sections, and a charge-collecting wiring 7c for the third photoelectric conversion sections are disposed in a stripe pattern.

Among others, when the photoelectric conversion sections are regularly arranged, it is preferable that the charge-collecting wirings be arranged in a stripe pattern. In this case, particularly, it is preferable that the same number of charge-collecting wirings as the number of kinds of the photoelectric conversion sections be disposed on each of the photoelectric conversion sections. For example, in FIG. 1, FIG. 2A and FIG. 2B, the photoelectric conversion layer 4 includes three kinds of photoelectric conversion sections (4a, 4b, and 4c), and three charge-collecting wirings (7a, 7b, and 7c) are arranged in a stripe pattern on each of the photoelectric conversion sections (4a, 4b, and 4c). When the charge-collecting wirings are disposed as such, the charge-collecting wirings can be disposed in a straight line form for the respective kinds of the photoelectric conversion sections, and the design of the openings of the insulating layer and the charge-collecting wirings is made easy.

The width of the charge-collecting wiring is not particularly limited as long as the charge-collecting wirings can be disposed on the openings of the insulating layer, an electrical connection between the back surface electrode layers located at the openings of the insulating layer and the charge-collecting wirings is enabled, and the charge-collecting wirings can be disposed such that the charge-collecting wirings that are connected to the back surface electrode layers formed on the photoelectric conversion sections of different kinds are not brought into contact. The width is appropriately selected in accordance with the shape, size, disposition and the like of the photoelectric conversion sections that display an intended arbitrary pattern; the shape, size, disposition and the like of the openings of the insulating layer; and the disposition of the charge-collecting wirings. Specifically, if the width of the charge-collecting wirings is too large, the disposition of the charge-collecting wirings may become difficult, and if the width of the charge-collecting wirings is too small, the disposition of the charge-collecting wirings is made easy, while there is a risk that the formation of the charge-collecting wirings may be difficult, or the reliability of the electrical connection of the back surface electrode layer and the charge-collecting wirings may decrease.

When the photoelectric conversion sections are regularly arranged, the width of the charge-collecting wirings is usually adjusted to be identical within the same kind of the photoelectric conversion sections.

The material used in the charge-collecting wirings is not particularly limited as long as it is a material having conductivity, and any conductive material used in general wirings can be used. Examples of the material include silver, aluminum, copper, and gold.

Regarding the method for forming the charge-collecting wiring, any general method for forming a wiring can be used, and wet methods and dry methods can both be applied. Examples thereof include printing methods such as gravure coating and screen printing, deposition methods, and photolithographic methods.

The thickness of the charge-collecting wirings is not particularly limited as long as it is a thickness which enables an electrical connection between the back surface electrode layers located at the openings of the insulating layer and the charge-collecting wirings, and the thickness is appropriately selected in accordance with the material used in the charge-collecting wirings.

3. Photoelectric Conversion Layer

The photoelectric conversion layer according to the present embodiment is a layer which is disposed between the transparent electrode layer and the back surface electrode layers, is formed in a pattern on the transparent electrode layer, and has plural kinds of photoelectric conversion sections having different absorption wavelength regions. Incidentally, the "photoelectric conversion layer" and the "photoelectric conversion sections" refer to the members that contribute to the charge separation of an organic thin film solar cell, and have a function of transporting electrons and holes thus generated, respectively toward the electrodes of opposite directions.

The number of kinds of the photoelectric conversion sections may be 2 or more kinds, and for example, 2 kinds or 3 kinds can be used.

It is desirable if the absorption wavelength regions of the photoelectric conversion sections of various kinds are different, and the absorption wavelength region is appropriately selected in accordance with the arbitrary pattern displayed by the photoelectric conversion sections, and the complementary colors of the light absorbed by the photoelectric conversion sections (the color of transmitted light that is observed).

The disposition of the photoelectric conversion sections is appropriately selected in accordance with the arbitrary pattern displayed by the photoelectric conversion sections. For example, as illustrated in FIG. 1 and FIG. 6A, the photoelectric conversion sections (4a, 4b, and 4c) may be regularly disposed, or as illustrated in FIG. 7A, the photoelectric conversion sections (4a and 4b) may be irregularly disposed. Furthermore, as illustrated in each of FIG. 1 and FIG. 6A, the photoelectric conversion sections (4a, 4b, and 4c) may be disposed such that an arbitrary pattern is displayed by dots, or as illustrated in FIG. 7A, the photoelectric conversion sections (4a and 4b) may be disposed such that an arbitrary pattern is displayed by planes.

Among others, it is preferable that the photoelectric conversion sections be regularly arranged. As discussed above, it is because it is possible to display an arbitrary pattern by dots.

When the photoelectric conversion sections are regularly arranged, the arrangement of the photoelectric conversion sections can be made similar to a general arrangement of pixels, and for example, stripe arrangement, mosaic arrangement, and delta arrangement can be used.

The size of the photoelectric conversion sections is appropriately selected in accordance with the arbitrary pattern displayed by the photoelectric conversion sections, the shape, size, disposition and the like of the openings of the insulating layer; and the width, disposition and the like of the charge-collecting wirings. When the photoelectric conversion sections are regularly arranged, the size of the photoelectric conversion sections can be adjusted to about 1 mm on each side to 30 mm on each side. When the photoelectric conversion sections are regularly arranged, if the photoelectric conversion sections are small, the disposition of the charge-collecting wirings may be difficult, and if the photoelectric conversion sections are large, it may be difficult to display an arbitrary pattern by dots.

When the photoelectric conversion sections are regularly arranged, the size of the photoelectric conversion sections may be identical or may be different in the photoelectric conversion sections. When the size of the photoelectric conversion sections is different in each of the photoelectric conversion sections, it is also possible to express the light and shade in accordance with the difference in the size of the photoelectric conversion sections.

The shape of the photoelectric conversion section is appropriately selected in accordance with the arbitrary pattern to be displayed by the photoelectric conversion sections; the shape, size, disposition and the like of the openings of the insulating layer; and the width, disposition and the like of the charge-collecting wirings. When the photoelectric conversion sections are regularly arranged, the shape of the photoelectric conversion section can be made into, for example, a rectangular shape, a polygonal shape, or a circular shape.

The photoelectric conversion section may be in a single layer having both an electron-accepting function and an electron-donating function (embodiment A), or may be such that an electron-accepting layer having the electron-accepting function and an electron-donating layer having the electron-donating function may be laminated (embodiment B). Hereinafter, the respective embodiments will be described.

(1) Embodiment A

The embodiment A of the photoelectric conversion section according to the present invention is a single layer having both an electron-accepting function and an electron-donating function, and contains an electron-donating material and an electron-accepting material. In this photoelectric conversion section, since charge separation occurs as a result of utilizing the pn junction that is formed within the photoelectric conversion section, the photoelectric conversion section has a photoelectric conversion function by itself.

The electron-donating material is not particularly limited as long as the material has the function as an electron-donator, but among others, the material is preferably an electron-donating conductive polymer material.

The conductive polymer is a so-called π-conjugated polymer, and since the polymer is established from a π-conjugated system in which carbon-carbon double bonds or triple bonds, or double bonds or triple bonds containing heteroatoms are alternately linked with single bonds, the polymer exhibits semiconductor-like properties. Since the conductive polymer material has π-conjugation developed in the main chain of the polymer, charge transport in the direction of the main chain is basically advantageous. Furthermore, since the electron transfer mechanism of the conductive polymer is mainly intermolecular hopping conduction caused by π-stacking, charge transport is advantageous not only in the main chain direction of the polymer but also in the thickness direction of the photoelectric conversion section. Furthermore, since the conductive polymer material can easily form a film by a wet method by using a coating liquid in which the conductive polymer material is dissolved or dispersed in a solvent, the conductive polymer material is advantageous in that large-sized organic thin film solar cells can be produced at low cost without requiring expensive facilities.

Examples of the electron-donating conductive polymer material include polyphenylene, polyphenylenevinylene, polysilane, polythiophene, polycarbazole, polyvinylcarbazole, porphyrin, polyacetylene, polypyrrole, polyaniline, polyfluorene, polyvinylpyrene, polyvinylanthracene, derivatives thereof, and copolymers thereof, or phthalocyanine-containing polymers, carbazole-containing polymers, and organometallic polymers.

Among those described above, a thiophene-fluorene copolymer, polyalkylthiophene, a phenyleneethynylene-phenylenevinylene copolymer, a phenyleneethynylene-thiophene copolymer, a phenyleneethynylene-fluorene copolymer, a fluorene-phenylenevinylene copolymer, a thiophene-phenylenevinylene copolymer and the like are preferably used. It is because these have appropriate energy potential differences as compared with many electron-accepting materials.

Incidentally, for example, the method for synthesizing a phenyleneethynylene-phenylenevinylene copolymer (poly[1,4-phenyleneethynylene-1,4-(2,5-dioctadodecyloxyphenylene)-1,4-phenyleneethene-1,2-diyl-1,4-(2,5-dioctadodecylo xyphenylene)ethene-1,2-diyl]) is described in detail in Macromolecules, 35, 3825 (2002), or Macromol. Chem. Phys., 202, 2712 (2001).

Furthermore, the electron-accepting material is not particularly limited as long as the material has the function as an electron acceptor, but among others, the electron-accepting material is preferably an electron-accepting conductive polymer material. It is because a conductive polymer material has advantages such as described above.

Examples of the electron-accepting conductive polymer material include polyphenylenevinylene, polyfluorene, derivatives thereof, and copolymers thereof, or carbon nanotubes, fullerene derivatives, CN group or $CF_3$ group-containing polymers, and —$CF_3$-substituted polymers thereof. Specific examples of the polyphenylenevinylene derivatives include CN-PPV (poly[2-methoxy-5-(2'-ethylhexyloxy)-1, 4-(1-cyanovinylene)phenylene]) and MEH-CN-PPV (poly [2-methoxy-5-(2'-ethylhexyloxy)-1,4-(1-cyanovinylene) phenylene]).

An electron-accepting material doped with an electron-donating compound, an electron-donating material doped with an electron-accepting compound, or the like can also be used. Among others, a conductive polymer material doped with an electron-donating compound or an electron-accepting compound is preferably used. It is because since a conductive polymer material has π-conjugation developed in the polymer main chain, charge transport in the main chain direction is basically advantageous. It is also because when an electron-donating compound or an electron-accepting compound is doped, charge is generated in the π-conjugated main chain, and the electrical conductivity can be greatly increased.

Examples of an electron-accepting conductive polymer material doped with an electron-donating compound include the electron-accepting conductive polymer materials described above. As the electron-donating compound to be doped, a Lewis base such as an alkali metal such as Li, K, Ca or Cs, or an alkaline earth metal can be used. Incidentally, a Lewis base acts as an electron donator.

Furthermore, examples of an electron-donating conductive polymer material doped with an electron-accepting compound include the electron-donating conductive polymer materials described above. As the electron-accepting compound to be doped, for example, a Lewis acid such as $FeCl_3$ (III), $AlCl_3$, $AlBr_3$, $AsF_6$, or a halogen compound can be used. Incidentally, the Lewis acid acts as an electron-acceptor.

As the thickness of the photoelectric conversion section, a film thickness that is generally employed in bulk heterojunction type organic thin film solar cells can be employed. Specifically, the thickness can be set in the range of 0.2 nm to 3000 nm, and preferably in the range of 1 nm to 600 nm. It is because if the thickness is thicker than the range described above, the volume resistance in the photoelectric conversion section may increase. On the other hand, it is because if the thickness is smaller than the range described above, the photoelectric conversion section may not be able to absorb light sufficiently.

The mixing ratio of the electron-donating material and the electron-accepting material is appropriately adjusted to an optimal mixing ratio depending on the type of the material used.

The method for forming a photoelectric conversion section is not particularly limited as long as it is a method by which the photoelectric conversion section can be formed in a pattern, and the photoelectric conversion section can be uniformly formed to have a predetermined thickness, and wet methods and dry methods can both be used. When wet methods are used, the photoelectric conversion sections can be formed in the atmosphere, reduction of cost can be promoted, and at the same time, size extension is facilitated.

In the case of wet methods, the method for applying a coating liquid for photoelectric conversion sections is not particularly limited as long as it is a method by which the photoelectric conversion section can be formed in a pattern, and the coating liquid for photoelectric conversion sections can be uniformly applied. Examples of the method include a die coating method, a spin coating method, a dip coating method, a roll coating method, a bead coating method, a spray coating method, a bar coating method, a gravure coating method, an inkjet method, a screen printing method, and an offset printing method.

After the application of the coating liquid for photoelectric conversion sections, a drying treatment for drying the coating film thus formed may be applied. It is because when the solvent or the like contained in the coating liquid for photoelectric conversion sections is removed early, productivity can be enhanced.

As the method for drying treatment, for example, general methods such as drying by heating, drying by air blowing, drying in a vacuum, and drying by infrared heating can be used.

(2) Embodiment B

The embodiment B of the photoelectric conversion section according to the present invention is a laminate of an electron-accepting layer having an electron-accepting function and an electron-donating layer having an electron-donating function. Hereinafter, the electron-accepting layer and the electron-donating layer will be described.

(Electron-Accepting Layer)

The electron-accepting layer used in the present embodiment has an electron-accepting function, and contains an electron-accepting material.

The electron-accepting material is not particularly limited as long as it has the function as an electron-acceptor, and among others, the electron-accepting material is preferably an electron-accepting conductive polymer material. It is because a conductive polymer material has the advantages such as described above. Specifically, the same material as the electron-accepting conductive polymer material used in the photoelectric conversion section of the embodiment A may be used.

As the thickness of the electron-accepting layer, a film thickness that is generally employed in bilayer type organic thin film solar cells can be employed. Specifically, the thickness can be set in the range of 0.1 nm to 1500 nm, and preferably in the range of 1 nm to 300 nm. It is because if the film thickness is larger than the range described above, there is a possibility that the volume resistance in the electron-accepting layer may increase. On the other hand, it is because if the film thickness is smaller than the range described above, the electron-accepting layer may not be able to absorb light sufficiently.

As the method for forming an electron-accepting layer, the same method as the method for forming a photoelectric conversion section of the embodiment A can be used.

(Electron-Donating Layer)

The electron-donating layer used in the present embodiment has an electron-donating function, and contains an electron-donating material.

The electron-donating material is not particularly limited as long as it has the function as an electron donator, but among others, the electron-donating material is preferably an electron-donating conductive polymer material. It is because the conductive polymer material has the advantages such as described above. Specifically, the same material as the electron-donating conductive polymer material used in the photoelectric conversion section of the embodiment A may be used.

As the thickness of the electron-donating layer, a film thickness that is generally employed in bilayer type organic thin film solar cells, can be employed. Specifically, the film thickness can be set in the range of 0.1 nm to 1500 nm, and preferably in the range of 1 nm to 300 nm. It is because if the film thickness is larger than the range described above, there is a possibility that the volume resistance in the electron-donating layer may increase. On the other hand, it is because if the thickness is smaller than the range described above, the electron-donating layer may not be able to absorb light sufficiently.

As the method for forming an electron-donating layer, the same method as the method for forming a photoelectric conversion section of the embodiment A can be used.

4. Transparent Electrode Layer

The transparent electrode layer according to the present embodiment is formed on one surface of the transparent substrate. The transparent electrode layer is usually made into an electrode for extracting holes that have been generated in the photoelectric conversion layer (hole extraction electrode). In the present invention, the transparent electrode layer side serves as the light-receiving surface.

The material that constitutes the transparent electrode layer is not particularly limited as long as the material has electrical conductivity and transparency, and examples thereof include In—Zn—O (IZO), In—Sn—O (ITO), ZnO—Al, and Zn—Sn—O.

The total light transmittance of the transparent electrode layer is preferably 85% or greater, and among others, the total light transmittance is preferably 90% or greater, and particularly preferably 92% or greater. It is because when the total light transmittance of the transparent electrode layer is in the range described above, the transparent electrode layer can sufficiently transmit light, and light can be efficiently absorbed at the photoelectric conversion layer.

Incidentally, the total light transmittance is a value in the visible light region, measured by using an SM Color Computer (product number: SM-C) manufactured by Suga Test Instruments Co., Ltd.

The transparent electrode layer may be a single layer, or may be a laminate using a material having a different work function.

Regarding the thickness of the transparent electrode layer, it is preferable that the film thickness in the case where the transparent electrode layer is a single layer, or the total film thickness in the case where the transparent electrode layer is composed of a plurality of layers, be in the rage of 0.1 nm to 500 nm, and among others, in the range of 1 nm to 300 nm. It is because if the film thickness is smaller than the range described above, there is a possibility that the sheet resistance of the transparent electrode layer may become too large, and the charge thus generated may not be sufficiently transferred to an external circuit. On the other hand, it is because if the thickness is larger than the range described above, there is a possibility that the total light transmittance may decrease and the photoelectric conversion efficiency may be decreased.

As the method for forming the transparent electrode layer, any general method for forming an electrode can be used.

5. Back Surface Electrode Layers

The back surface electrode layers according to the present embodiment are respectively formed on the photoelectric conversion sections, and are formed in a plural number. The back surface electrode layer is an electrode that faces the transparent electrode layer, and is usually made into an electrode for extracting electrons that have been generated in the photoelectric conversion layer (electron extraction electrode).

The material that constitutes the back surface electrode layer is not particularly limited as long as the material has electrical conductivity, but it is preferable to appropriately select the material by taking the work function and the like of the constituent material of the transparent electrode layer into consideration. For example, when a material having a high work function is used as the constituent material of the transparent electrode layer, it is preferable to use a material having a low work function as the constituent material of the back surface electrode layer. Particularly, it is preferable that the constituent material of the back surface electrode layer have reflectivity. It is because the visibility of the arbitrary pattern displayed by the photoelectric conversion sections can be enhanced. Specific examples of the material include Al, Ag, Cu, and Au.

The back surface electrode layer may be a single layer, or may be a laminate obtained by using a material having a different work function.

Regarding the thickness of the back surface electrode layer, it is preferable that the film thickness in the case where the back surface electrode layer is a single layer, or the total film thickness of layers in the case where the back surface electrode layer is composed of a plurality of layers, be in the range of 0.1 nm to 500 nm, and among others, in the range of 1 nm to 300 nm. If the film thickness is smaller than the range described above, there is a possibility that the sheet resistance of the back surface electrode layer may become too large, and the charge thus generated may not be sufficiently transferred to an external circuit.

The method for forming the back surface electrode layer is not particularly limited as long as it is a method capable of forming back surface electrode layers respectively on the photoelectric conversion sections, and any general method for forming an electrode can be used.

6. Transparent Substrate

The transparent substrate used in the present embodiment supports the transparent electrode layer, the photoelectric conversion layer, the back surface electrode layers, the insulating layer, and the like.

There are no particular limitations on the transparent substrate, and examples thereof include transparent rigid materials having no flexibility, such as quartz glass, Pyrex (registered trademark) and synthetic quartz plates; and transparent flexible materials having flexibility such as transparent resin films and optical resin plates.

Among them, it is preferable that the transparent substrate be a flexible material such as a transparent resin film. It is because the transparent resin film has excellent processability, is useful for the reduction of the production cost, weight reduction, and the realization of an organic thin film solar cell which does not crack easily, and has extensive applicability to various applications such as the applicability to curved surfaces.

7. Hole Extraction Layer

Figure 9:
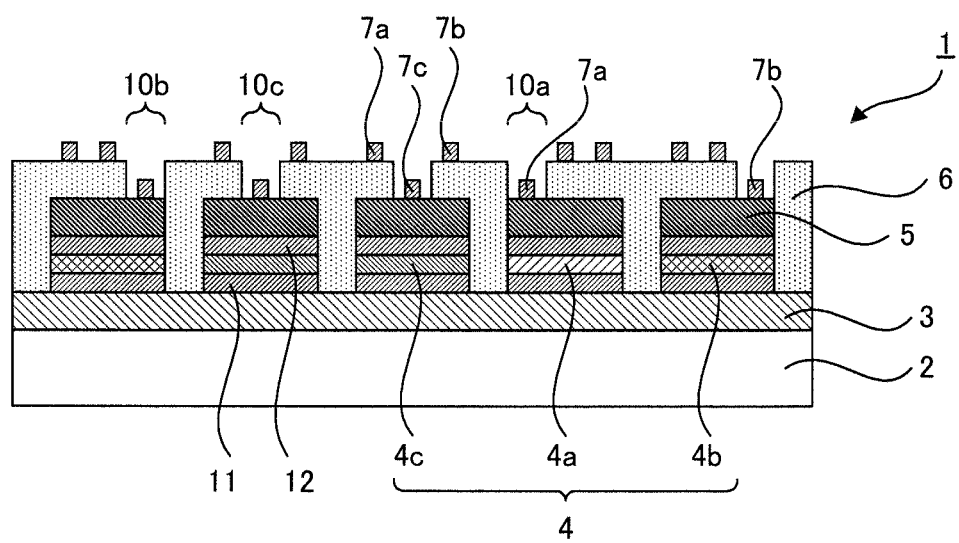
FIG. 9 is a schematic cross-sectional view illustrating an example of the organic thin film solar cell module of the present invention.

In the present embodiment, as illustrated in FIG. 9, a hole extraction layer 11 may be formed between the photoelectric conversion layer 4 and the transparent electrode layer 3. The hole extraction layer is a layer provided so as to facilitate the extraction of holes from the photoelectric conversion layer to the hole extraction electrode. Since the hole extraction efficiency from the photoelectric conversion layer to the hole extraction electrode can be increased thereby, the photoelectric conversion efficiency can be enhanced.

The material used in the hole extraction layer is not particularly limited as long as the material stabilizes the hole extraction from the photoelectric conversion layer to the hole extraction electrode. Specific examples thereof include electrically conductive organic compounds such as a doped polyaniline, polyphenylenevinylene, polythiophene, polypyrrole, poly(para-phenylene), polyacetylene, and triphenyldiamine (TPD); and organic materials forming charge transfer complexes formed from electron-donating compounds such as tetrathiofulvalene and tetramethylphenylenediamine, and electron-accepting compounds such as tetracyanoquinodimethane and tetracyanoethylene. Furthermore, thin films of metals or the like such as Au, In, Ag and Pd can also be used. Furthermore, thin films of metals or the like may be formed singly, or combinations thereof with the organic materials described above may also be used.

Among these, particularly, polyethylenedioxythiophene (PEDOT) and triphenyldiamine (TPD) are preferably used.

The thickness of the hole extraction layer is, in the case where the organic materials described above are used, preferably in the range of 10 nm to 200 nm, and in the case where the hole extraction layer is a metal thin film, the thickness is preferably in the range of 0.1 nm to 5 nm.

8. Electron Extraction Layer

In the present embodiment, as illustrated in FIG. 9, an electron extraction layer 12 may be formed between the photoelectric conversion layer 4 and the back surface electrode layer 5. The electron extraction layer is a layer provided so as to facilitate the extraction of electrons from the photoelectric conversion layer to the electron extraction electrode. Since the electron extraction efficiency from the photoelectric conversion layer to the electron extraction electrode can be increased thereby, the photoelectric conversion efficiency can be enhanced.

The material used in the electron extraction layer is not particularly limited as long as the material stabilizes the extraction of electrons from the photoelectric conversion layer to the electron extraction electrode. Specific examples thereof include electrically conductive organic compounds such as a doped polyaniline, polyphenylenevinylene, polythiophene, polypyrrole, poly(para-phenylene), polyacetylene, and triphenyldiamine (TPD); and organic materials forming charge transfer complexes formed from electron-donating compounds such as tetrathiofulvalene and tetramethylphenylenediamine, and electron-accepting compounds such as tetracyanoquinodimethane and tetracyanoethylene. Other examples include metal-doped layers produced from alkali metals or alkaline earth metals. Suitable materials include metal-doped layers formed from basocuproin (BCP) or basophenanthrone (Bphen) and Li, Cs, Ba or Sr.

9. Colored Layer

In the present embodiment, a colored layer may be formed in accordance with the kind of the photoelectric conversion section, between the transparent substrate and the transparent electrode layer. It is because the colored layer increases color purity and thereby enables clear display.

Figure 10:
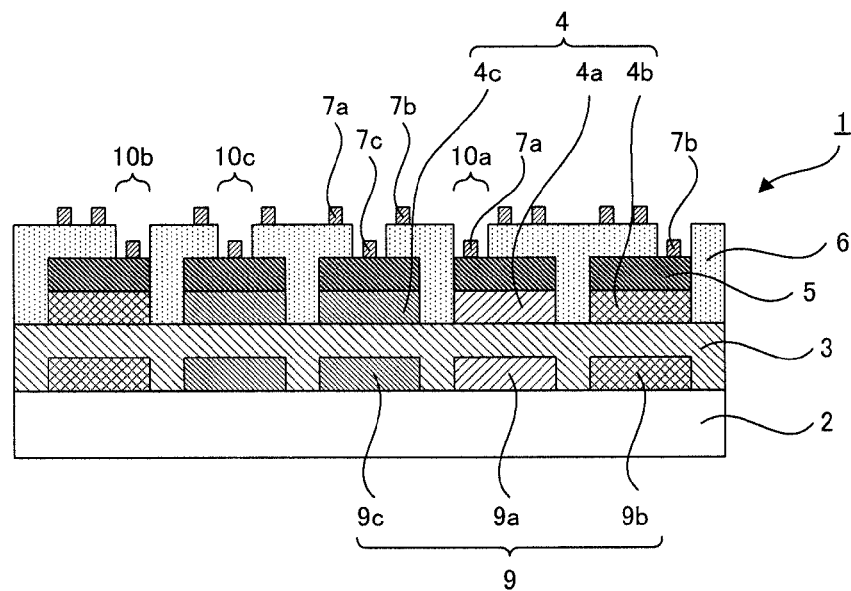
FIG. 10 is a schematic cross-sectional view illustrating another example of the organic solar cell module of the present invention.

The colored layer may be disposed on the photoelectric conversion sections of all kinds, or may be disposed on the photoelectric conversion sections of an arbitrary kind. When the colored layer is disposed on the photoelectric conversion sections of all kinds, the color purity can be further enhanced. For example, in FIG. 10, colored layers of a plurality of colors (9a, 9b, and 9c) are formed between the transparent substrate 2 and the transparent electrode layer 3, and a first colored layer 9a is formed on the first photoelectric conversion sections 4a; a second colored layer 9b is formed on the second photoelectric conversion sections 4b; and a third colored layer 9c is formed on the third photoelectric conversion sections 4c, so that colored layers (9a, 9b, and 9c) of different colors are formed on the respective kinds of the photoelectric conversion sections (4a, 4b, and 4c).

The colors of the colored layers formed on the photoelectric conversion sections are appropriately selected in accordance with the absorption wavelength regions of the photoelectric conversion sections.

Furthermore, in regard to the size, shape, disposition and the like of the colored layers formed on the photoelectric conversion sections, the same size, shape, disposition and the like of the photoelectric conversion sections can be applied.

Incidentally, since the colored layer can be produced in the same manner as in the case of general color filters, further explanation will not be given here.

10. Other Constitutions

The organic thin film solar cell module of the present embodiment may comprise constituent members that will be described below as necessary, in addition to the constituent members described above. For example, the organic thin film solar cell module of the present embodiment may comprise functional layers such as a protective sheet, a filler material layer, a barrier layer, a protective hard coat layer, a strength supporting layer, an anti-fouling layer, a high light-reflective layer, a light shielding layer, and a sealing material layer. Furthermore, adhesive layers may also be formed between the various functional layers, in accordance with the layer configuration.

Furthermore, in regard to these functional layers, the same functional layers as those described in JP 2007-073717 and the like can be used.

B. Second Embodiment

The organic solar cell module of the present embodiment is a dye-sensitized solar cell module.

Hereinafter, various configurations of the dye-sensitized solar cell module of the present embodiment will be described.

Incidentally, in regard to the insulating layer, the charge-collecting wirings, the transparent electrode layer, the back surface electrode layer, the transparent substrate, and the colored layer according to the present embodiment, since the same layers as those described in the section "A. First Embodiment" can be used, further explanations will not be given here.

1. Photoelectric Conversion Layer

The photoelectric conversion layer according to the present embodiment is formed in a pattern on the back surface electrode layer, and has plural kinds of photoelectric conversion sections having different absorption wavelength regions.

Incidentally, in regard to the disposition, size and shape of the photoelectric conversion sections, since the same matters as those described in the section "A. First Embodiment, 3. Photoelectric conversion layer" can be applied, further explanation will not be given here.

The photoelectric conversion sections have metal oxide semiconductor fine particles having a sensitizing dye supported on the surface. The metal oxide semiconductor fine particles and the sensitizing dye according to the present embodiment will be described below.

(a) Metal Oxide Semiconductor Fine Particles

There are no particular limitations on the metal oxide semiconductor fine particles used in the present embodiment, as long as the metal oxide semiconductor fine particles are formed of a metal oxide having semiconductor characteristics. Examples of the metal oxide that constitutes the metal oxide semiconductor fine particles used in the present embodiment include $TiO_2$, $ZnO$, $SnO_2$, $ITO$, $ZrO_2$, $MgO$, $Al_2O_3$, $CeO_2$, $Bi_2O_3$, $Mn_3O_4$, $Y_2O_3$, $WO_3$, $Ta_2O_5$, $Nb_2O_5$, and $La_2O_3$. Among them, in the present embodiment, it is most preferable to use metal oxide semiconductor fine particles formed of $TiO_2$. It is because $TiO_2$ has particularly excellent semiconductor characteristics.

(b) Sensitizing Dye

The sensitizing dye used in the present embodiment is not particularly limited as long as the sensitizing dye is capable of absorbing light and thereby generating an electromotive force. Examples of such a sensitizing dye include organic dyes and metal complex dyes. Examples of the organic dyes include acridine dyes, azo dyes, indigo dyes, quinone dyes, coumarin dyes, merocyanine dyes, phenylxanthene dyes, indoline dyes, and carbazole dyes. In the present embodiment, among these organic dyes, it is preferable to use coumarin dyes. Furthermore, as the metal complex dyes, it is preferable to use ruthenium dyes, and it is particularly preferable to use ruthenium-bipyridine dye and ruthenium-terpyridine dye, which are ruthenium complexes. It is because since these ruthenium complexes have broad wavelength ranges of light that is absorbed, the wavelength region of the light that can be photoelectrically converted can be greatly broadened.

(c) Optional Components

The photoelectric conversion layer used in the present embodiment may contain optional components in addition to the components described above. Examples of the optional components used in the present embodiment include a resin. It is because when the photoelectric conversion layer contains a resin, the brittleness of the photoelectric conversion layer used in the present embodiment can be improved.

2. Electrolyte Layer

The electrolyte layer used in the present embodiment will be described. The electrolyte layer used in the present embodiment is formed on the photoelectric conversion layer described above, and includes a redox couple.

The redox couple used in the electrolyte layer according to the present embodiment is not particularly limited as long as the redox couple is a redox couple generally used in the electrolyte layer of a dye-sensitized solar cell. Among others, the redox couple used in the present embodiment is preferably a combination of iodine and an iodide, or a combination of bromine and a bromide.

Examples of the combination of iodine and an iodide used in the present embodiment as the redox couple include combinations of $I_2$ with metal iodides such as LiI, NaI, KI and $CaI_2$. Furthermore, examples of the combination of bromine and a bromide include combinations of $Br_2$ with metal bromides such as LiBr, NaBr, KBr, and $CaBr_2$.

The electrolyte layer according to the present embodiment may contain, as other compounds in addition to the redox couple, additives such as a crosslinking agent, a photopolymerization initiator, a thickening agent, and a normal temperature-melting salt.

The electrolyte layer may be an electrolyte layer formed in any of a gel state, a solid state and a liquid state. When the electrolyte layer is produced in a gel state, the gel may be any of a physical gel and a chemical gel. Here, the physical gel is a product gelling at near room temperature as a result of physical interaction, and a chemical gel is a gel formed by chemical bonding through a crosslinking reaction or the like. Furthermore, when the electrolyte layer is produced in a liquid state, for example, an electrolyte layer which uses acetonitrile, methoxyacetonitrile, propylene carbonate or the like as a solvent and contains a redox couple, or an ionic liquid containing the same imidazolium salt as a cation, can be used as a solvent. Furthermore, when the electrolyte layer is produced in a solid state, an electrolyte layer which does not contain a redox couple and functions as a hole transporting agent by itself may be used, or a hole transporting agent containing, for example, CuI, polypyrrole or polythiophene may also be used.

3. Other Constitutions

The dye-sensitized solar cell module of the present embodiment may have a catalyst layer as necessary, in addition to the constituent members described above. The catalyst layer is formed between the electrolyte layer and the transparent electrode layer or the back surface electrode layer.

When the catalyst layer is formed, the dye-sensitized solar cell module of the present embodiment can have superior power generation efficiency. Examples of such a catalyst layer include, but are not limited to, a form in which Pt is deposited on the transparent electrode layer, and a form in which a catalyst layer is formed from polyethylenedioxythiophene (PEDOT), polystyrenesulfonic acid (PSS), polyaniline (PA), para-toluenesulfonic acid (PTS) and mixtures thereof.

The thickness of such a catalyst layer is preferably in the range of 5 nm to 500 nm, and among others, in the range of 10 nm to 300 nm, and particularly preferably in the range of 15 nm to 100 nm.

Incidentally, in regard to the constituent members other than the catalyst layer, since the same constituent members as those described in the section "A. First Embodiment, 10. Other members" can be used, further explanation will not be given here.

II. Organic Solar Cell Panel

The organic solar cell panel of the present invention comprises the organic solar cell module described above, and a plurality of voltage conversion sections that are connected to the charge-collecting wirings for the respective kinds of the photoelectric conversion sections of the organic solar cell module.

Figure 11:
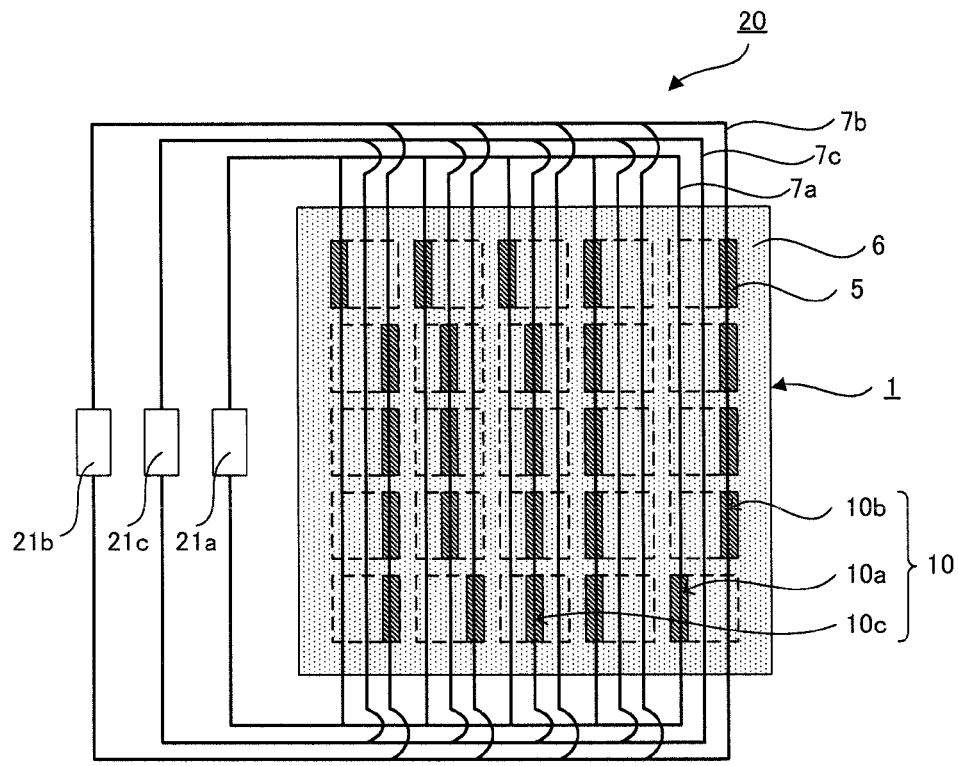
FIG. 11 is a schematic view illustrating an example of the organic solar cell panel of the present invention.

FIG. 11 is a schematic view illustrating an example of the organic solar cell panel of the present invention. The organic solar cell panel 10 illustrated in FIG. 11 comprises the organic solar cell module 1 illustrated in each of FIG. 1, FIG. 2A and FIG. 2B, and a plurality of voltage conversion sections (21a, 21b, and 21c) connected to a plurality of charge-collecting wirings (7a, 7b, and 7c) for the respective kinds of the photoelectric conversion sections of the organic solar cell module 1.

The voltage conversion sections (21a, 21b, and 21c) are connected to the charge-collecting wirings for the respective kinds of the photoelectric conversion sections. As illustrated in each of FIG. 1, FIG. 2A, FIG. 2B, and FIG. 11, in the first photoelectric conversion sections 4a, a voltage conversion section 21a for the first photoelectric conversion sections is connected to all the charge-collecting wirings 7a for the first photoelectric conversion sections that are connected to the back surface electrode layers 5 formed on the first photoelectric conversion sections 4a; in the second photoelectric conversion sections 4b, a voltage conversion section 21b for the second photoelectric conversion sections is connected to all the charge-collecting wirings 7b for the second photoelectric conversion sections that are connected to the back surface electrode layers 5 formed on the second photoelectric conversion sections 4b; and in the third photoelectric conversion sections 4c, a voltage conversion section 21c for the third photoelectric conversion sections is connected to all the charge-collecting wirings 7c for the third photoelectric conversion sections that are connected to the back surface electrode layers 5 formed on the third photoelectric conversion sections 4c. As illustrated in FIG. 11, the organic thin film solar cell panel 10 includes the same number (3 in FIG. 11) of the voltage conversion sections (21a, 21b, and 21c) as the number of kinds of the photoelectric conversion sections (3 kinds in FIG. 11).

According to the present invention, since the organic solar panel comprises the organic solar cell module described above, the organic solar cell panel can be produced into an organic solar cell panel having a display function and excellent design characteristics. Furthermore, electric power can be output to an external circuit for each kind of the photoelectric conversion sections, solar cell characteristics can be stably exhibited, and the safety of the organic solar cell module can also be secured.

Incidentally, since the organic solar cell module has been described in detail in the section "I. Organic solar cell module," further explanation will not be given here. Other configurations of the organic solar cell panel will be described below.

1. Voltage Conversion Section

The voltage conversion section used in the present invention is connected to the charge-collecting wiring for each kind of the photoelectric conversion sections of the organic solar cell module, and is formed in a plural number.

Incidentally, the phrase "the voltage conversion sections are connected to the charge-collecting wirings for the respective kinds of the photoelectric conversion sections" implies that the organic solar cell panel comprises the same number of voltage conversion sections as the number of kinds of the photoelectric conversion sections, and these voltage conversion sections are connected to the charge-collecting wirings for the respective kinds of the photoelectric conversion sections.

As the voltage conversion section, for example, a general step-up DC-DC converter, or a general step-down DC-DC converter can be used. When a region where one photoelectric conversion section is provided is used as one photovoltaic cell, if the output voltage of the organic solar cell panel is larger than the voltage generated between the transparent electrode layer and the back surface electrode layer of each photovoltaic cell at the time of light irradiation, a step-up DC-DC converter is used. On the other hand, if the output voltage of the organic solar cell panel is smaller than the voltage generated between the transparent electrode layer and the back surface electrode layer of each photovoltaic cell at the time of light irradiation, a step-down DC-DC converter is used.

The present invention is not intended to be limited to the embodiments described above. The embodiments are only for illustrative purposes, and any embodiments which have substantially the same constitution as the technical idea described in the claims of the present invention and offer the same effect, are included in the technical scope of the present invention.

EXAMPLES

Hereinafter, the present invention will be specifically described by way of Examples.

Example 1

An ITO layer (transparent electrode layer) was formed on a PET film substrate having a thickness of 125 μm by a sputtering method.

Next, polythiophene (P3HT: poly(3-hexylthiophene-2,5-diyl)) and C60PCBM ([6,6]-phenyl-C61-butyric acid mettric ester: manufactured by Nano-C, Inc.) were dissolved in bromobenzene, and a coating liquid for first photoelectric conversion section at a solids concentration of 1.4 wt % was prepared. Subsequently, the coating liquid for first photoelectric conversion section was applied patternwise on the PET film substrate by a gravure coating method, and then the coating liquid was dried for 10 minutes at 100° C. to form a first photoelectric conversion section. The absorption wavelength region of this first photoelectric conversion section was a green light region, and at the first photoelectric conversion section, red light was transmitted and was seen as red color. Furthermore, as the pattern of the first photoelectric conversion section, the pattern of the first photoelectric conversion section 4a illustrated in FIG. 3 was used, and the size of the first photoelectric conversion section was adjusted to 12 mm×12 mm.

Next, MDMO-PPV (poly[2-methoxy-5-(3',7'-dimethyloctyloxy)-1,4-phenylenevinylene]) and C60PCBM were dissolved in chlorobenzene, and thus a coating liquid for second photoelectric conversion section at a solids concentration of 1.4 wt % was prepared. Subsequently, the coating liquid for second photoelectric conversion section was applied patternwise on the PET film substrate by a gravure coating method, and then the coating liquid was dried for 10 minutes at 100° C. to form a second photoelectric conversion section. The absorption wavelength region of this second photoelectric conversion section was a blue light region, and at the second photoelectric conversion section, orange-colored light was transmitted and was seen as orange color. Furthermore, as the pattern of the second photoelectric conversion section, the pattern of the second photoelectric conversion section 4b illustrated in FIG. 3 was used, and the size of the second photoelectric conversion section was adjusted to be the same as the size of the first photoelectric conversion section.

Next, a fluorene-thiophene copolymer (poly[(9,9-dihexylfluorenyl-2,7-diyl)-co-(bithiophene)]) and C60PCBM were dissolved in chlorobenzene, and thus a coating liquid for third photoelectric conversion section at a solids concentration of 0.5 wt % was prepared. Subsequently, the coating liquid for third photoelectric conversion section was applied patternwise on the PET film substrate by a gravure coating method, and then the coating liquid was dried for 10 minutes at 100° C. to form a third photoelectric conversion section. The absorption wavelength region of this third photoelectric conversion section was a violet light region, and at the third photoelectric conversion section, yellow light was transmitted and was seen as yellow color. Furthermore, as the pattern of the third photoelectric conversion section, the pattern of the third photoelectric conversion section 4c illustrated in FIG. 3 was used, and the size of the third photoelectric conversion section was adjusted to be the same as the size of the first photoelectric conversion section.

Next, aluminum layers (back surface electrode layers) were respectively formed on the photoelectric conversion sections by a vacuum deposition method.

Next, on the PET film substrate on which the three kinds of the photoelectric conversion sections and the back surface electrode layer had been formed, an epoxy resin was applied patternwise by a gravure coating method, and the epoxy resin was cured by a heating treatment. Thereby, an insulating layer which had an opening for each of the photoelectric conversion sections illustrated in FIG. 1, and had openings that were matched with the positions in the photoelectric conversion sections for the respective kinds of the photoelectric conversion section, was formed. The size of the openings of the insulating layer was adjusted to 10 mm×10 mm.

Next, a silver paste was applied patternwise by a gravure coating method, at a disposition by which the back surface electrode layers located at the openings of the insulating layer provided on the photoelectric conversion sections of the same kind, were connected with each other. Thus, the charge-collecting wirings illustrated in FIG. 1 were formed.

A continuous operation test of the organic thin film solar cell was carried out, and the organic solar cell operated stably.

Example 2

Production of Counter Electrode Substrate

An ITO layer (transparent electrode layer) was formed on a PET film substrate having a thickness of 125 μm by a sputtering method. Next, platinum was laminated to a thickness of 13 Å (transmittance 72%) on the ITO layer, and thereby a catalyst layer was formed. Thereby, a counter electrode substrate was obtained.

(Production of First Oxide Semiconductor Electrode Substrate)

Next, a stainless steel substrate (SUS304, specific resistance: $0.7 \times 10^{-6}$ Ω·m) having a thickness of 50 μm was used as a first metal layer, and on the stainless steel substrate, a Cr layer having a thickness of 15 nm was formed as a second metal layer by vacuum deposition. Thus, a back surface electrode layer substrate was obtained.

Next, in an ink prepared by dispersing $TiO_2$ fine particles (P25™, manufactured by Nippon Aerosil Co., Ltd.) in ethanol, polyvinylpyrrolidone (K-90™, manufactured by Nippon Shokubai Co., Ltd.) was added at a solid content ratio of 5%, and thus a coating liquid for forming a porous layer was obtained. Subsequently, the coating liquid for forming a porous layer was applied on a Cr layer of the back surface electrode layer substrate by a doctor blade method, and then the coating liquid was dried at 120° C. to obtain a layer for forming a porous layer having a thickness of 7 μm was obtained. Next, a pressure of 0.1 t/cm was applied to the layer for forming a porous layer with a pressing machine, and the layer for forming a porous layer obtained after pressing was calcined for 30 minutes at 500° C.

Next, a sensitizing dye (D358™, manufactured by Mitsubishi Paper Mills, Ltd.) was dissolved in a mixed solution of acetonitrile/t-butanol=1/1 to a concentration of $3.0 \times 10^{-4}$ mol/l, and thereby a dye sensitizer solution was prepared. Subsequently, a masking tape having openings only at the sites that were wished to be colored was attached on the porous layer, and then the porous layer was immersed in the dye sensitizer solution for 3 hours. After the immersion, the porous layer was pulled out from the dye sensitizer solution, and the dye sensitizer solution adhering to the porous layer was washed with acetonitrile. The porous layer was air-dried, and then the masking tape was detached. Thereby, a first photoelectric conversion section in which only predetermined sites were selectively colored violet was formed. In this manner, a first oxide semiconductor electrode substrate was obtained.

(Production of Second Oxide Semiconductor Electrode Substrate)

A porous layer was formed on a back surface electrode layer substrate in the same manner as in the production of the first oxide semiconductor electrode substrate.

Next, a second photoelectric conversion section in which only predetermined sites were selectively colored orange was formed by using a sensitizing dye (D131™, manufactured by Mitsubishi Paper Mills, Ltd.) by the same process as that used in the case of using a sensitizing dye (D358™, manufactured by Mitsubishi Paper Mills, Ltd.). In this manner, a second oxide semiconductor electrode substrate was obtained.

(Production of Third Oxide Semiconductor Electrode Substrate)

A porous layer was formed on a back surface electrode layer substrate in the same manner as in the production of the first oxide semiconductor electrode substrate.

Next, a third photoelectric conversion section in which only predetermined sites were selectively colored red was formed by using a sensitizing dye (D102™, manufactured by Mitsubishi Paper Mills, Ltd.) by the same process as that used in the case of using a sensitizing dye (D358™, manufactured by Mitsubishi Paper Mills, Ltd.). In this manner, a third oxide semiconductor electrode substrate was obtained.

(Formation of Electrolyte Layer)

Next, in a solution obtained by dissolving 0.14 g of cationic hydroxycellulose (Jellner QH200™, manufactured by Daicel Corporation) in 2.72 g of ethanol, 0.043 g of potassium iodide was introduced and dissolved by stirring. To that solution, 0.18 g of 1-ethyl-3-methylimidazolium tetracyanoborate (EMIm-B(CN)4), 0.5 g of 1-propyl-3-methylimidazolium iodide (PMIm-I), and 20.025 g of iodine (I) were added thereto, and the mixture was dissolved by stirring. Thereby, a coatable electrolyte solution was prepared. The electrolyte solution was applied on the respective photoelectric conversion sections of the three kinds of the oxide semiconductor electrode substrates by a doctor blade method, and then the electrolyte solution was dried at 100° C. Thus, electrolyte layers were formed.

(Bonding)

The three kinds of oxide semiconductor electrode substrates having an electrolyte layer formed thereon were cut to a predetermined size. Thereafter, the positions of the electrolyte layers of the respective oxide semiconductor electrode substrates and the catalyst layer of the counter electrode substrate were aligned to face each other, and thereby the respective cut oxide semiconductor electrode substrates were bonded to the counter electrode substrate with an adhesive.

(Formation of Insulating Layer)

Next, an epoxy resin was applied patternwise on the back surface electrode layer by a gravure coating method, and the epoxy resin was cured by a heating treatment. Thus, an insulating layer which had an opening for each of the photoelectric conversion section and had openings that were matched with the positions in the photoelectric conversion sections for the respective kinds of the photoelectric conversion sections, as illustrated in FIG. 1, was formed.

(Formation of Charge-Collecting Wirings)

Next, a silver paste was applied patternwise by a gravure coating method, at a disposition by which the back surface electrode layers located at the openings of the insulating layer provided on the photoelectric conversion sections of the same kind, were connected with each other. Thus, the charge-collecting wirings illustrated in FIG. 1 were formed.

A continuous operation test of the dye-sensitized solar cell was carried out, and the organic solar cell operated stably.

REFERENCE SIGNS LIST

1 Organic solar cell module
2 Transparent substrate
3 Transparent electrode layer
4 Photoelectric conversion layer
4a First photoelectric conversion section
4b Second photoelectric conversion section
4c Third photoelectric conversion section
5 Back surface electrode layer
6 Insulating layer 7a Charge-collecting wiring for first photoelectric conversion section
7b Charge-collecting wiring for second photoelectric conversion section
7c Charge-collecting wiring for third photoelectric conversion section
10 Opening
10a Opening for first photoelectric conversion section
10b Opening for second photoelectric conversion section
10c Opening for third photoelectric conversion section
11 Hole extraction layer
12 Electron extraction layer
20 Organic solar cell panel

The invention claimed is:

1. An organic solar cell module comprising:
a transparent substrate;
a transparent electrode layer formed on the transparent substrate;
a photoelectric conversion layer that is formed in a pattern on the transparent electrode layer and includes plural kinds of photoelectric conversion sections, each kind of which has a different absorption wavelength region;
a plurality of back surface electrode layers respectively formed on the photoelectric conversion sections;
an insulating layer that is formed so as to cover the plurality of back surface electrode layers and has an opening for each of the photoelectric conversion sections; and
a plurality of charge collecting wirings that are formed on the insulating layer and are disposed so as to be connected to the back surface electrode layers located at the opening of the insulating layer for the respective kinds of the photoelectric conversion sections,
wherein each kind of the photoelectric conversion sections includes plural numbers of photoelectric conversion sections which have the same absorption wavelength region, and the photoelectric conversion sections are regularly arranged,
wherein the charge-collecting wirings do not connect plural numbers of photovoltaic cells which are part of the organic solar cell module and include the plural kinds of photoelectric conversion sections respectively, but only plural numbers of photovoltaic cells with the same absorption wavelength region, which are part of the organic solar cell module and include the photoelectric conversion sections with the same absorption wavelength regions respectively, in parallel,
wherein the openings of the insulating layers are disposed so as to connect the back surface electrode layers formed on the photoelectric conversion sections with the same absorption wavelength regions by means of the charge-collecting wirings, while the openings of the insulating layers are disposed so as to be matched with positions in the photoelectric conversion sections for the respective kinds of the photoelectric conversions sections, and are disposed within a single region when the photoelectric conversions sections are partitioned into the same number of regions as the number of kinds of the photoelectric conversion sections in a direction perpendicular to a longitudinal direction of the charge-collecting wirings and
wherein the charge-collecting wirings are disposed so as to connect the back surface electrode layers that are located at the openings of the insulating layer provided on the photoelectric conversion sections with the same absorption wavelength regions, the plurality of charge-collecting wirings are arranged in a stripe pattern, and the same number of charge-collecting wirings as the number of kinds of the photoelectric conversion sections are respectively disposed on the photoelectric conversion sections.

2. The organic solar cell module according to claim 1, wherein the organic solar cell module is an organic thin film solar cell module or a dye-sensitized solar cell module.

3. An organic solar cell panel comprising:
the organic solar cell module according to claim 1, and
a plurality of voltage conversion sections connected to the charge-collecting wirings for the respective kinds of the photoelectric conversion sections of the organic solar cell module.

4. An organic solar cell panel comprising:
the organic solar cell module according to claim 2, and
a plurality of voltage conversion sections connected to the charge-collecting wirings for the respective kinds of the photoelectric conversion sections of the organic solar cell module.

* * * * *